US 8,743,557 B2

(12) United States Patent
Mano et al.

(10) Patent No.: US 8,743,557 B2
(45) Date of Patent: Jun. 3, 2014

(54) PRINTED WIRING BOARD

(75) Inventors: Yasuhiko Mano, Ogaki (JP); Shinobu Kato, Ogaki (JP); Haruhiko Morita, Ogaki (JP); Satoshi Kurokawa, Ogaki (JP)

(73) Assignee: IBIDEN Co., Ltd., Ogaki-shi (JP)

(*) Notice: Subject to any disclaimer, the term of this patent is extended or adjusted under 35 U.S.C. 154(b) by 205 days.

(21) Appl. No.: 13/484,448

(22) Filed: May 31, 2012

(65) Prior Publication Data

US 2013/0020116 A1    Jan. 24, 2013

Related U.S. Application Data

(60) Provisional application No. 61/510,238, filed on Jul. 21, 2011.

(51) Int. Cl.
*H05K 7/00* (2006.01)
*H05K 1/11* (2006.01)

(52) U.S. Cl.
USPC ........... 361/777; 174/250; 174/261; 361/748; 361/778; 361/807

(58) Field of Classification Search
CPC ....... H05K 1/111; H05K 1/112; H05K 1/115; H05K 1/141; H05K 1/117; H05K 1/144; H05K 3/4602; H05K 2201/096
USPC ................ 174/250, 255, 260–262, 264–266; 361/736, 748, 760, 792, 799, 777, 778, 361/784, 790, 807–810
See application file for complete search history.

(56) References Cited

U.S. PATENT DOCUMENTS

| | | | |
|---|---|---|---|
| 2003/0042585 A1* | 3/2003 | Corisis et al. | 257/668 |
| 2006/0146509 A1* | 7/2006 | David | 361/783 |
| 2007/0178766 A1* | 8/2007 | Banerjee et al. | 439/638 |
| 2008/0236876 A1* | 10/2008 | Kodama et al. | 174/260 |

FOREIGN PATENT DOCUMENTS

JP    2006-091753    4/2006

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A printed wiring board has a packaging substrate having multiple pads, and a transmission substrate mounted on the multiple pads of the packaging substrate. The packaging substrate has a pad group constituted of pads which mount an electronic component, the multiple pads mounting the transmission substrate includes a first pad positioned in a peripheral portion of the packaging substrate and a second pad positioned between the first pad and the pad group, the second pad is electrically connected to a signal pad of the pads in the pad group, and the transmission substrate includes a horizontal wiring which electrically connects the second pad and the first pad and which transmits a signal between the second pad and the first pad.

20 Claims, 22 Drawing Sheets

FIG. 4
(A)
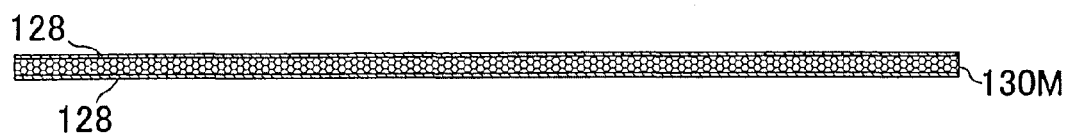
(B)
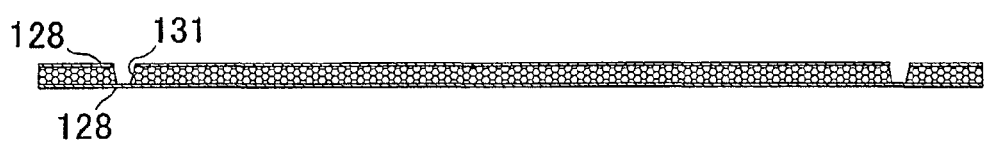
(C)
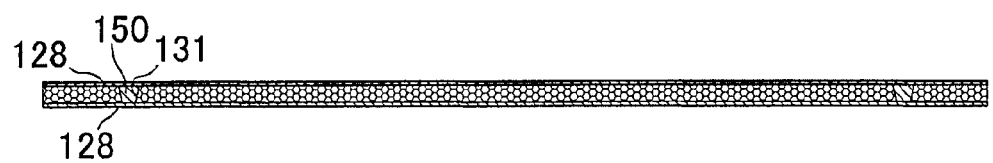
(D)
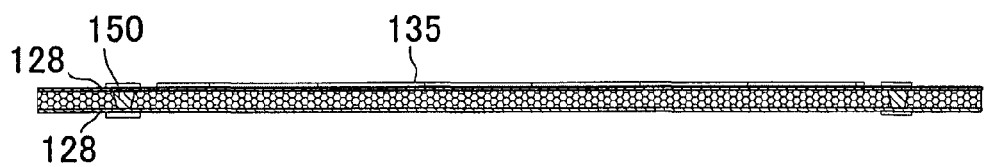
(E)
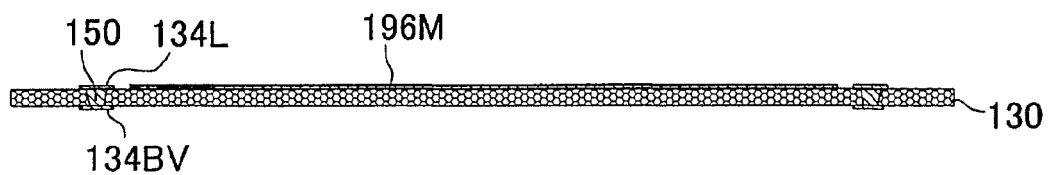

FIG. 6
(A)
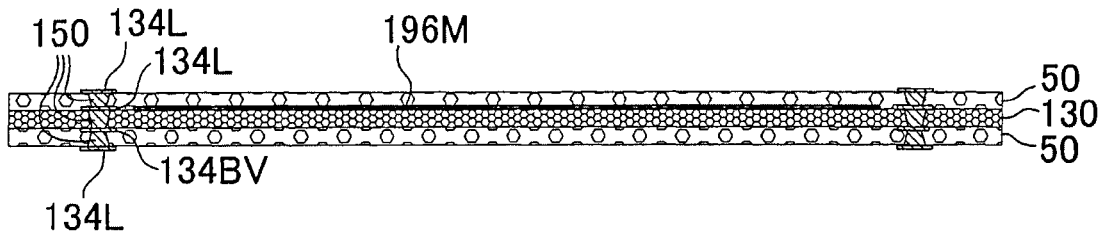
(B)
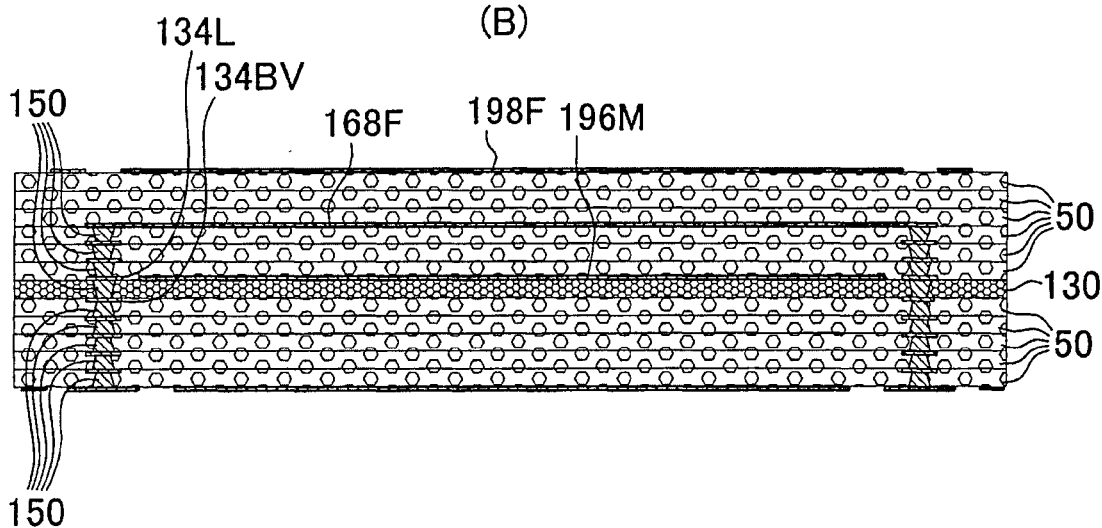
(C)
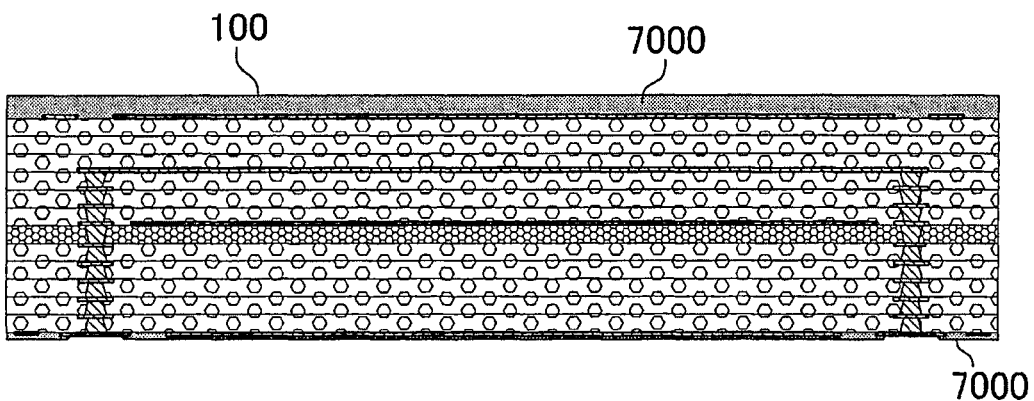

FIG. 11
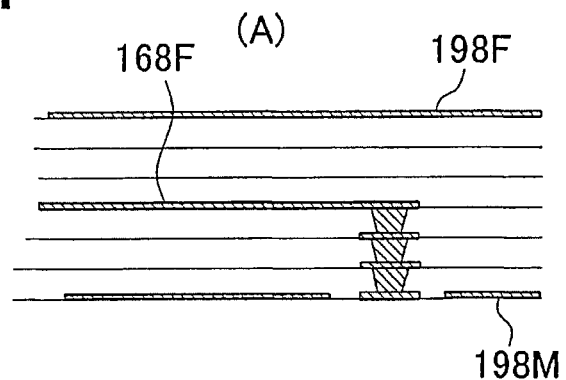
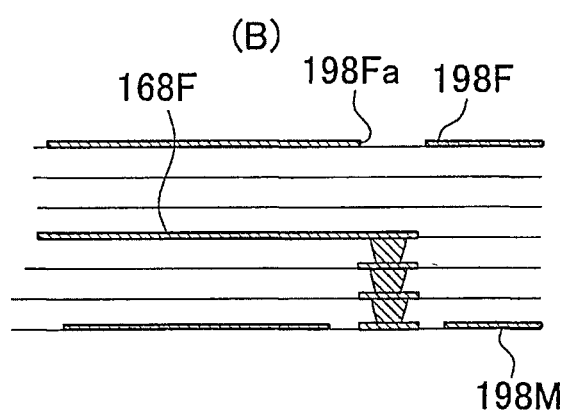
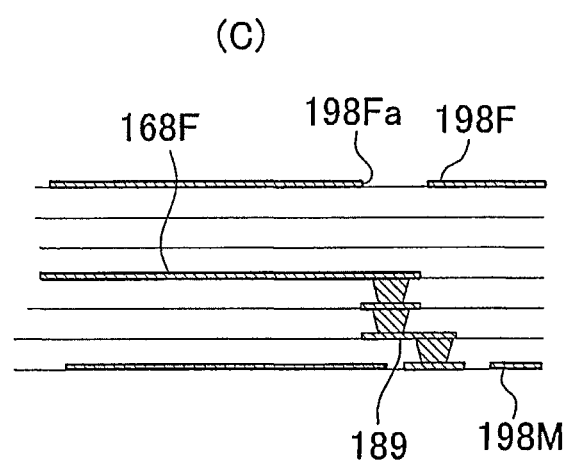

FIG. 13
(A)
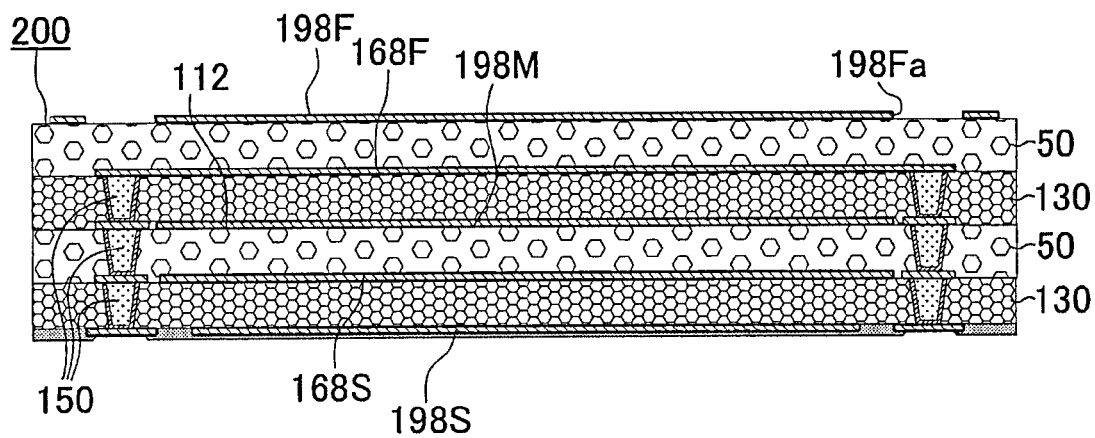
(B)
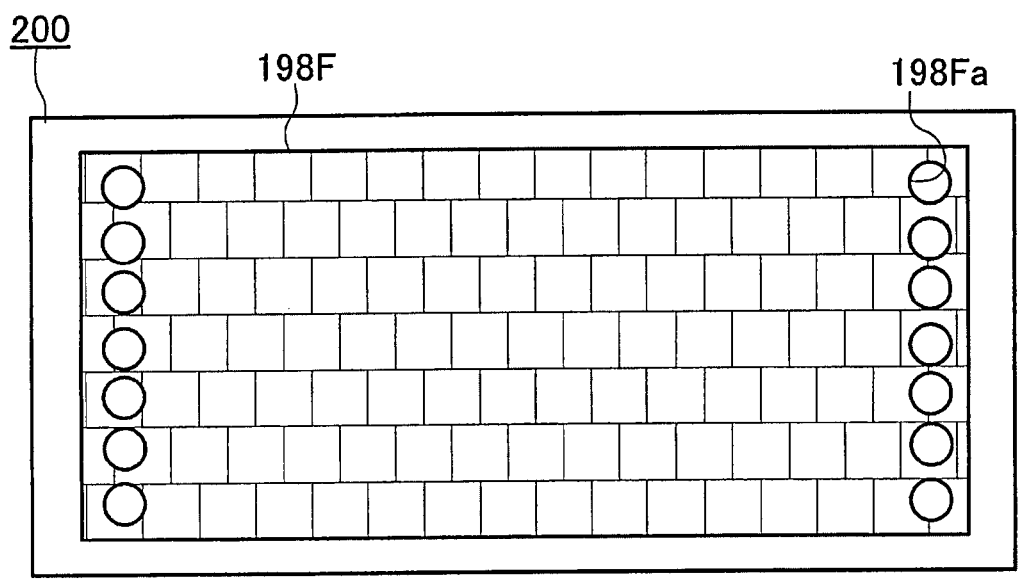

FIG. 16
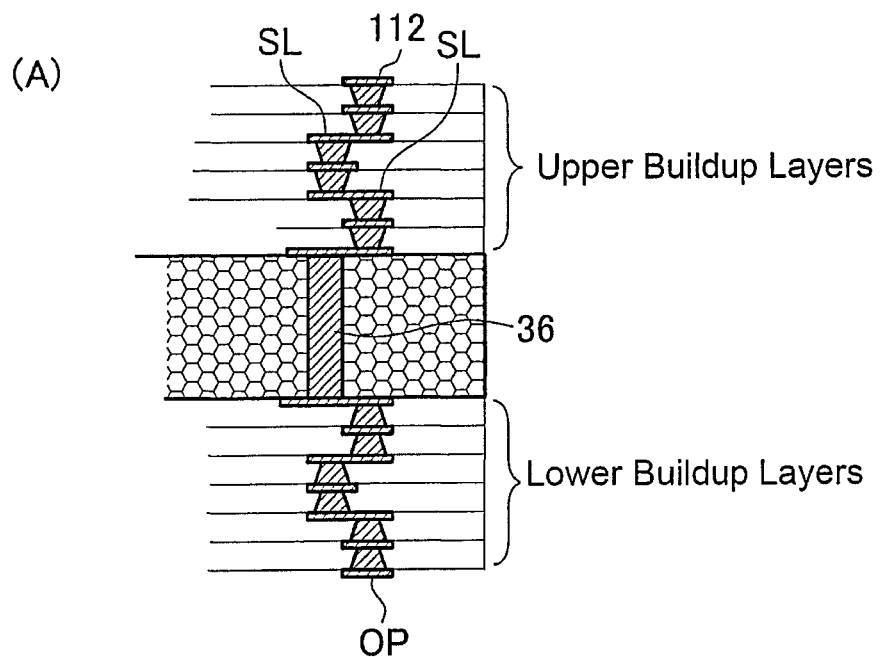
(A)
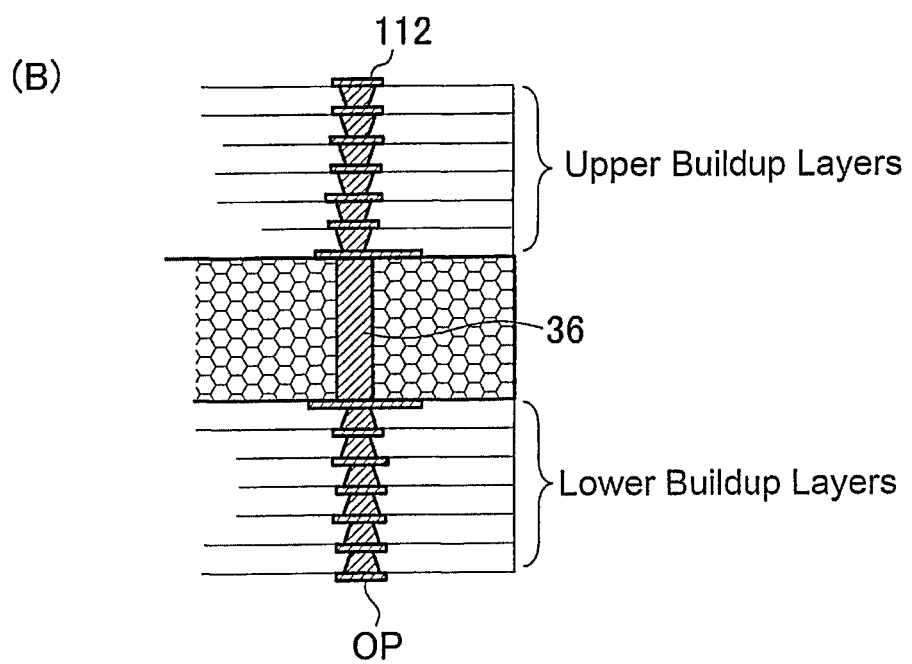
(B)

FIG. 17
(A)
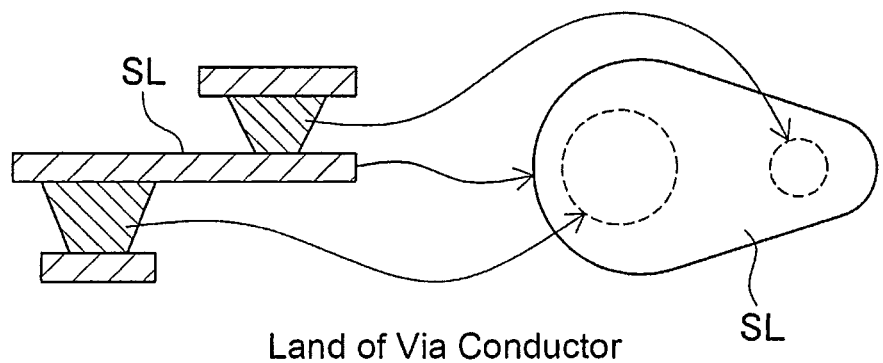
Land of Via Conductor
(B)
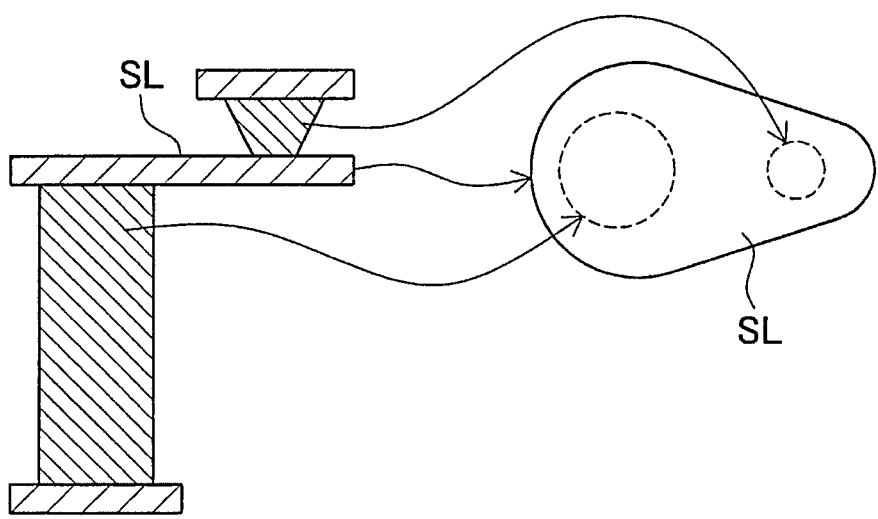
Land of Through-Hole Conductor

FIG. 20
(A)
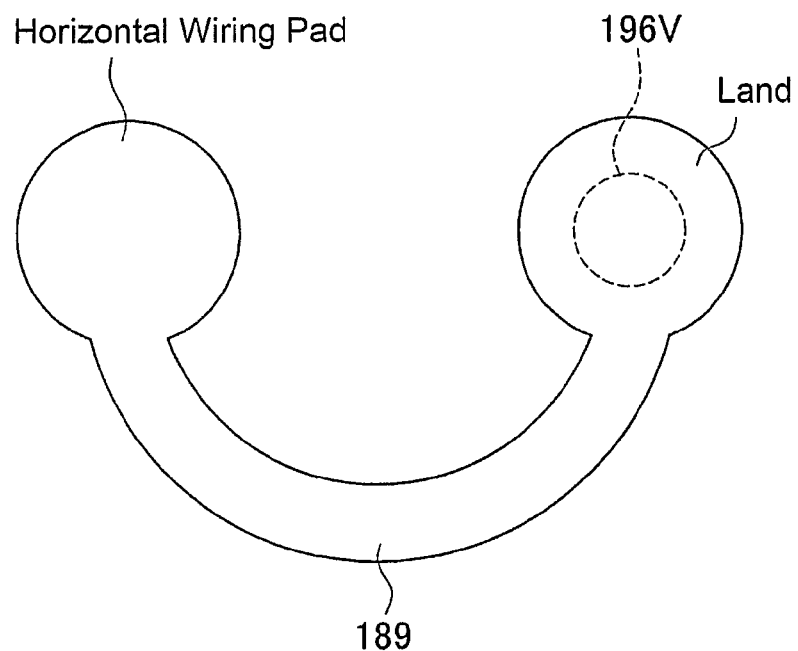
(B)
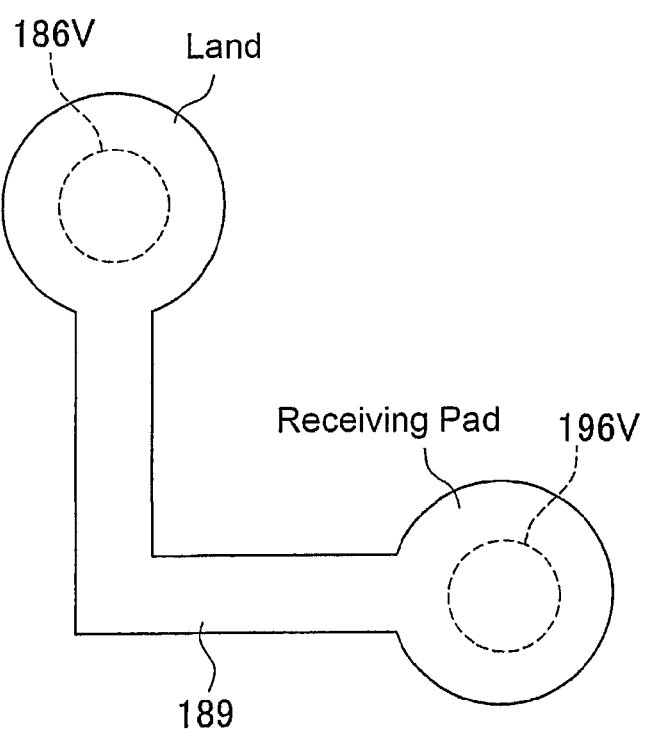

FIG. 22
(A)
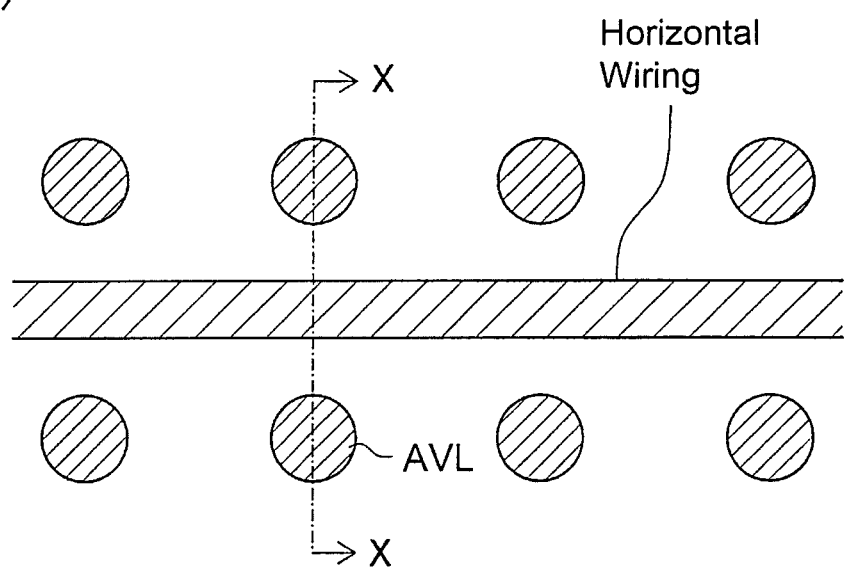
(B)
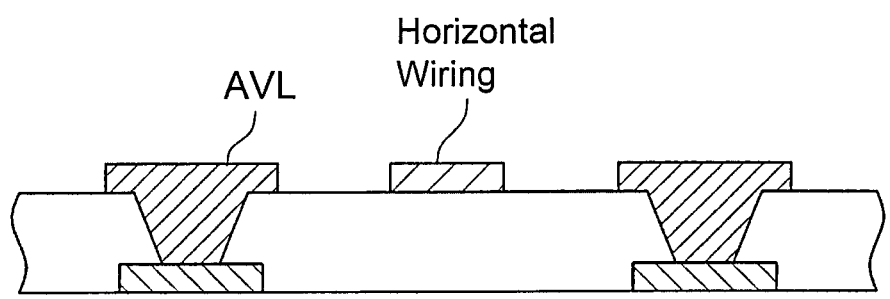

PRINTED WIRING BOARD

CROSS-REFERENCE TO RELATED APPLICATIONS

The present application is based on and claims the benefit of priority to U.S. Application Ser. No. 61/510,238, filed Jul. 21, 2011, the entire contents of which are incorporated herein by reference.

BACKGROUND OF THE INVENTION

1. Field of the Invention

The present invention relates to a printed wiring board which is formed with a packaging substrate for mounting an IC chip and a transmission substrate mounted on the packaging substrate.

2. Discussion of the Background

Conventionally, frequencies of signals to be transmitted through a packaging substrate were usually set in one range, and such a substrate was designed to achieve impedance matching according to the frequency range. Japanese Laid-Open Patent Publication No. 2006-91753 describes a technology to transmit high-speed signals. The entire contents of this publication are incorporated herein by reference.

SUMMARY OF THE INVENTION

According to one aspect of the present invention, a printed wiring board has a packaging substrate having multiple pads, and a transmission substrate mounted on the multiple pads of the packaging substrate. The packaging substrate has a pad group constituted of pads which mount an electronic component, the multiple pads mounting the transmission substrate includes a first pad positioned in a peripheral portion of the packaging substrate and a second pad positioned between the first pad and the pad group, the second pad is electrically connected to a signal pad of the pads in the pad group, and the transmission substrate includes a horizontal wiring which electrically connects the second pad and the first pad and which transmits a signal between the second pad and the first pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-4(E) are views showing steps for manufacturing a transmission substrate according to the first embodiment;

FIGS. 6(A)-6(C) are views showing steps for manufacturing a transmission substrate according to the first embodiment;

FIGS. 11(A)-11(C) are views showing transmission substrates according to three embodiments;

FIG. 13(A) is a cross-sectional view of a transmission substrate according to a second embodiment of the present invention, and FIG. 13(B) is a plan view of a first ground layer;

FIGS. 16(A)-16(B) are views showing high-speed signal routes in a packaging substrate;

FIGS. 17(A)-17(B) are views showing connection lines in high-speed signal routes;

FIGS. 20(A)-20(B) are examples of detouring wiring;

FIGS. 22(A)-22(B) are views showing horizontal wiring and lands formed along the horizontal wiring.

DETAILED DESCRIPTION OF THE EMBODIMENTS

Figure 1:
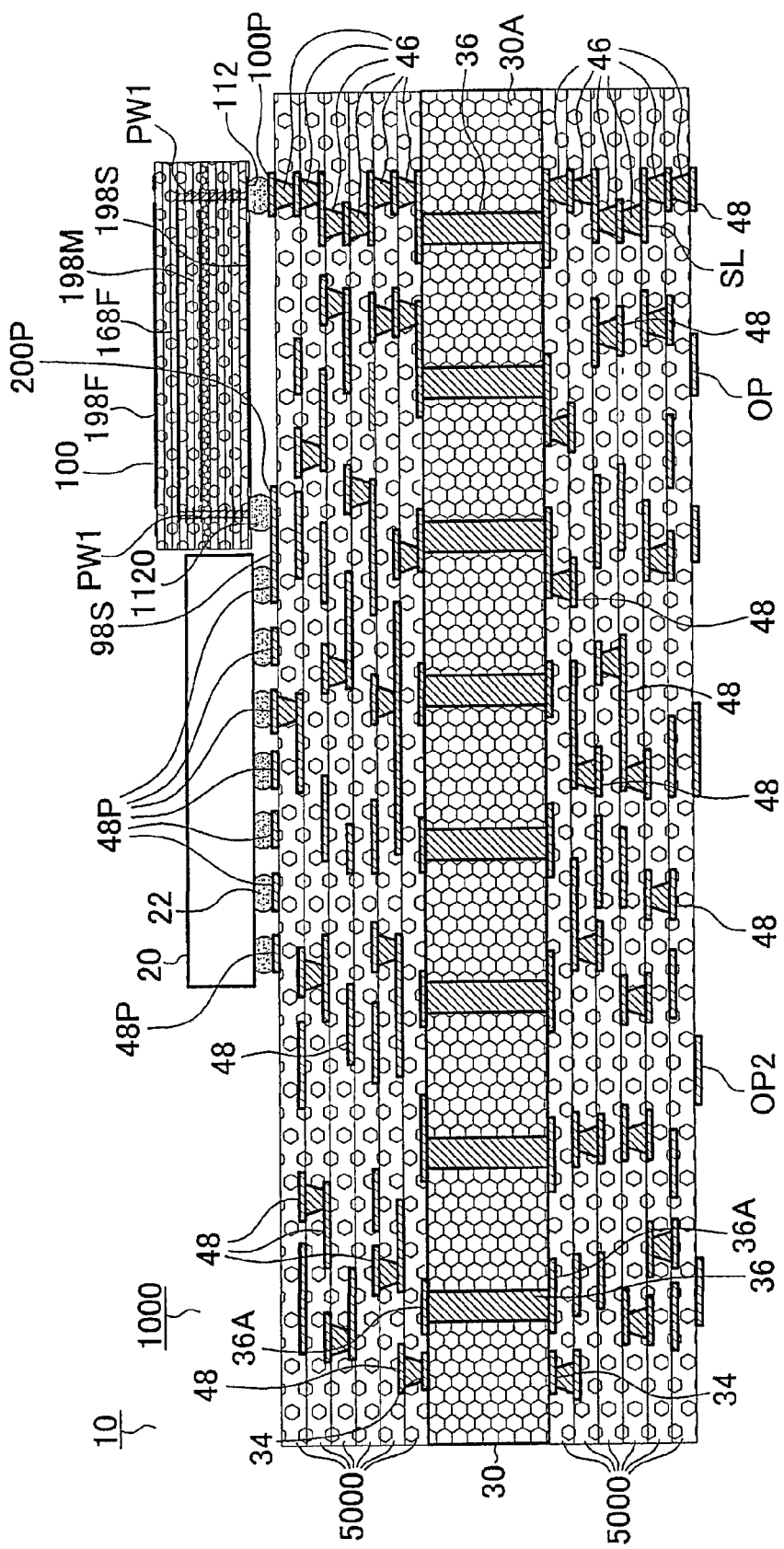
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

Figure 21:
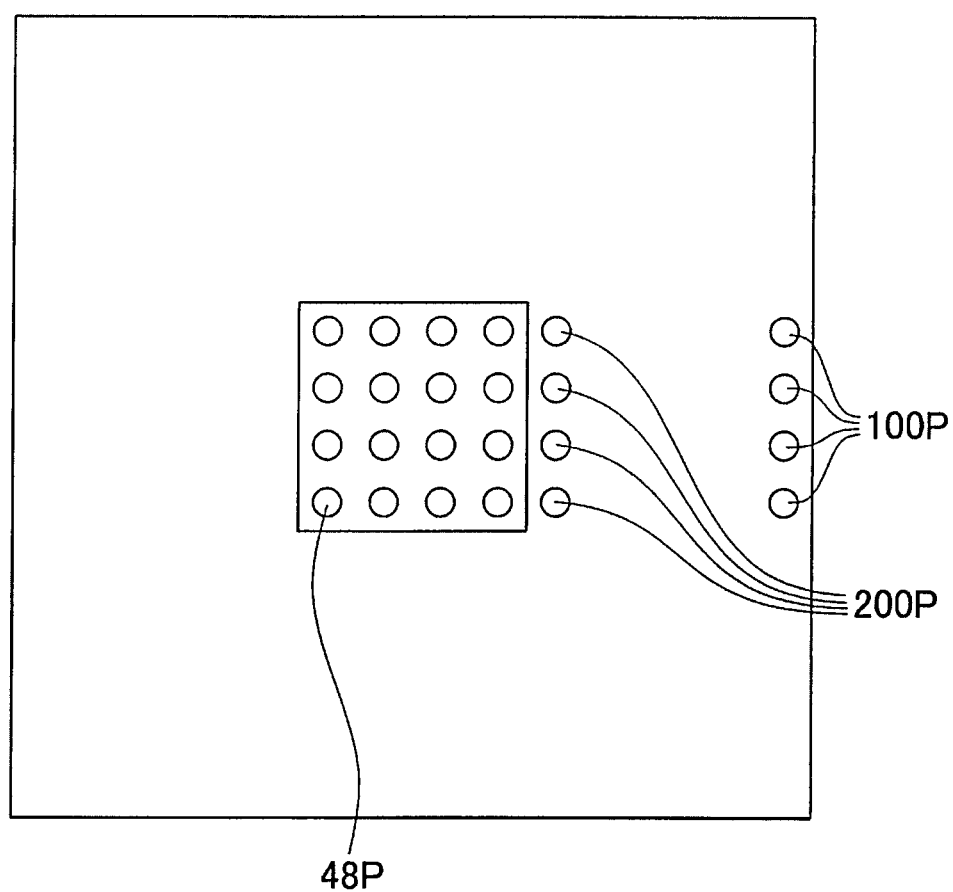
FIG. 21 is a view showing a pad group, first pads and second pads.

FIG. 1 shows a cross-sectional view of printed wiring board 10 according to a first embodiment of the present invention. Printed wiring board 10 is formed with packaging substrate 1000 and transmission substrate 100. A pad group is formed in substantially the center of the packaging substrate, and IC chip 20 is mounted on the packaging substrate through solder bumps 22 on the pad group. In addition, transmission substrate 100 is mounted on the packaging substrate in a region excluding where the pad group is formed. Packaging substrate 1000 has core substrate 30 having a first surface and a second surface opposite the first surface and buildup layers on the core substrate. Buildup layers include upper buildup layers on the first surface of the core substrate and lower buildup layers on the second surface of the core substrate. An IC chip is formed on the upper buildup layers. The core substrate has resin substrate (30A), conductive circuits 34 formed on upper and lower surfaces of the resin substrate and through-hole conductor 36 connecting the upper and lower conductive circuits. Conductive circuit 34 includes through-hole land (36A). Buildup layers have conductive layer 48 and interlayer resin insulation layer 5000 which are alternately laminated on core substrate 30. Different conductive layers are connected by via conductor 46 formed in interlayer resin insulation layer 5000. A pad group for mounting an electronic component is formed on the outermost buildup layer. Such a pad group is formed in substantially the center of the packaging substrate and formed with multiple pads (48P). Then, first pads (100P) and second pads (200P) for mounting transmission substrate 100 are formed in a region excluding where the pad group is formed. FIG. 21 shows the pad group, first pads and second pads. The first pads and second pads are arrayed in a line, for example. Multiple first pads are formed in the peripheral region of the packaging substrate, and multiple second pads are formed between the first pads and the pad group. The distance is short for high-speed signals to be transmitted horizontally in the packaging substrate. A solder-resist layer is formed on the upper surface of the packaging substrate. The solder-resist layer has an opening that partially exposes a pad. A solder bump is formed on a pad exposed through an opening. The solder-resist layer is omitted in FIG. 1.

Transmission substrate 100 is mounted on the packaging substrate through first solder bump 112 on a first pad and second solder bump 1120 on a second pad. High-speed signals are transmitted between a signal pad in the pad group and an external terminal (OP) formed on a lower buildup layer by way of a second pad, horizontal wiring in the transmission substrate, a first pad, via conductors in the upper buildup layers, a through-hole conductor and via conductors in the lower buildup layers. In such a route (high-speed signal route), it is preferred for via conductors in the upper buildup layers to be formed directly above a through-hole conductor, while via conductors in the lower buildup layers are formed directly under the through-hole conductor (FIG. 16(B)). The structure shown in FIG. 16(B) is a full-stack structure. Signal attenuation in the packaging substrate is reduced. Here, high-speed signals are approximately 10 GHz or higher.

However, if full-stack structures are concentrated directly under first pads, the density of conductors in the packaging substrate becomes uneven, thus warping tends to occur in the packaging substrate. To prevent such warping, not all via structures in the upper and lower buildup layers are required to be in a stacked structure in a high-speed signal route (FIG. 16(A)). In such a case, connection line (SL) is formed within the high-speed signal route, as shown in FIG. 17. Connection line (SL) is preferred to be a land of a via conductor (FIG. 17(A)) or a land of a through-hole conductor (FIG. 17(B)). It is also an option for a high-speed signal route to include a full-stack structure (FIG. 16(B)) as well as a non-full-stack structure (FIG. 16(A)). Warping in the package and transmission loss in high-speed signals are reduced.

Figure 2:
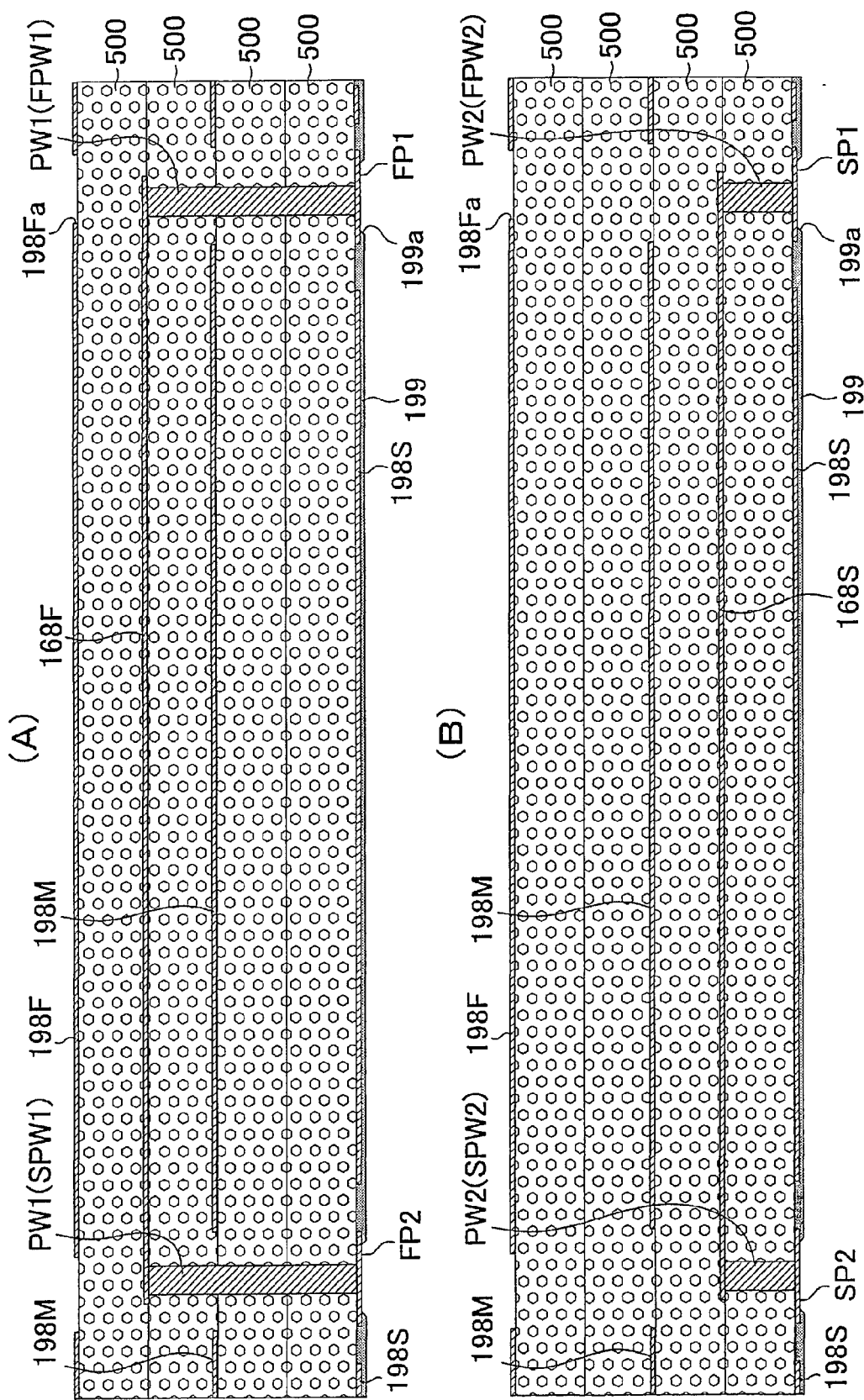
FIGS. 2(A)-2(B) are views to illustrate a transmission substrate of the first embodiment.

Low-speed signals are mostly 6 GHz or lower. Low-speed signals are transmitted between a signal pad in the pad group and external terminal (OP2) by way of a signal circuit in the packaging substrate without going through the transmission substrate. Signal pads include a high-speed signal pad and a low-speed signal pad, and external terminals include high-speed external terminal (OP) and low-speed external terminal (OP2). The speed of high-speed signals transmitted through horizontal wirings (168F, 168S) in transmission substrate 100 is 20 Gbps (10 GHz) or higher. FIG. 2 shows views of horizontal wirings. FIG. 2(A) is a cross-sectional view including horizontal wiring (168F), and FIG. 2(B) is a cross-sectional view including horizontal wiring (168S). Horizontal wiring (168F) is sandwiched by ground layers (198F, 198M), and horizontal wiring (168S) is sandwiched by ground layers (198M, 198S). Horizontal wirings are striplines. High-speed signals from IC chip 20 are transmitted to transmission substrate 100 through outermost-layer transmission route (98S) of the packaging substrate. In transmission substrate 100, high-speed signals are transmitted upward through a vertical wiring. Then, high-speed signals are transmitted through a horizontal wiring toward the peripheral region of the printed wiring board. Next, high-speed signals are transmitted to the packaging substrate through a vertical wiring. Then, high-speed signals are transmitted to external terminal (OP) by way of a high-speed signal route in the packaging substrate (via conductors 46 in the upper buildup layers, through-hole conductor 36, via conductors 46 in the lower buildup layers). Horizontal wiring (168S) is not shown in FIG. 1.

The transmission substrate has horizontal wirings 168 (168F, 168S) for transmitting high-speed signals, insulation layers 500 sandwiching horizontal wirings, and ground layers 198 (198F, 198M, 198S) sandwiching horizontal wirings with insulation layers in between (FIG. 2). A first horizontal wiring is sandwiched by ground layer (198F) and ground layer (198M). A second horizontal wiring is sandwiched by ground layer (198M) and ground layer (198S). Transmission substrate 100 has two types of horizontal wirings (168F, 168S). Input signals to the IC chip are transmitted through horizontal wiring (168F) and output signals from the IC chip are transmitted through horizontal wiring (168S). Moreover, the transmission substrate includes first vertical wirings (PW1) (FPW1, SPW1), second vertical wirings (PW2) (FPW2, SPW2), first horizontal wiring pads (FP) (FP1, FP2), and second horizontal wiring pads (SP) (SP1, SP2).

First horizontal wiring pads (FP) include first horizontal wiring pad 1 (FP1) which faces a first pad of the packaging substrate, and first horizontal wiring pad 2 (FP2) which faces a second pad of the packaging substrate. Second horizontal wiring pads (SP) include second horizontal wiring pad 1 (SP1) which faces a first pad of the packaging substrate and second horizontal wiring pad 2 (SP2) which faces a second pad of the packaging substrate.

First vertical wirings (PW1) (FPW1, SPW1) include first vertical wiring 1 (FPW1) which connects an end of first horizontal wiring (168F) and first horizontal wiring pad 1 (FP1), and first vertical wiring 2 (SPW1) which connects the other end of first horizontal wiring (168F) and first horizontal wiring pad 2 (FP2). Second vertical wirings (PW2) (FPW2, SPW2) include second vertical wiring 1 (FPW2) which connects an end of second horizontal wiring (168S) and second horizontal wiring pad 1 (SP1), and second vertical wiring 2 (SPW2) which connects the other end of second horizontal wiring (168S) and second horizontal wiring pad 2 (SP2).

Input signals to the IC chip are input to the transmission substrate through first horizontal wiring pad 1 (FP1). Then, high-speed signals are transmitted to a first horizontal wiring through first vertical wiring 1. Next, high-speed signals are transmitted to the central portion of the printed wiring board from the peripheral portion of the printed wiring board by way of a first horizontal wiring. Then, high-speed signals are transmitted to first horizontal wiring pad 2 (FP2) through first vertical wiring 2 and output to the packaging substrate.

Output signals from the IC chip are input to the transmission substrate through second horizontal wiring pad 2 (SP2). Then, high-speed signals are transmitted to a second horizontal wiring through second vertical wiring 2. Next, high-speed signals are transmitted toward the peripheral portion of the printed wiring board from the central portion of the printed wiring board using a second horizontal wiring. Then, high-speed signals are transmitted to second horizontal wiring pad 1 (SP1) through second vertical wiring 1 to be output to the packaging substrate.

Figure 3:
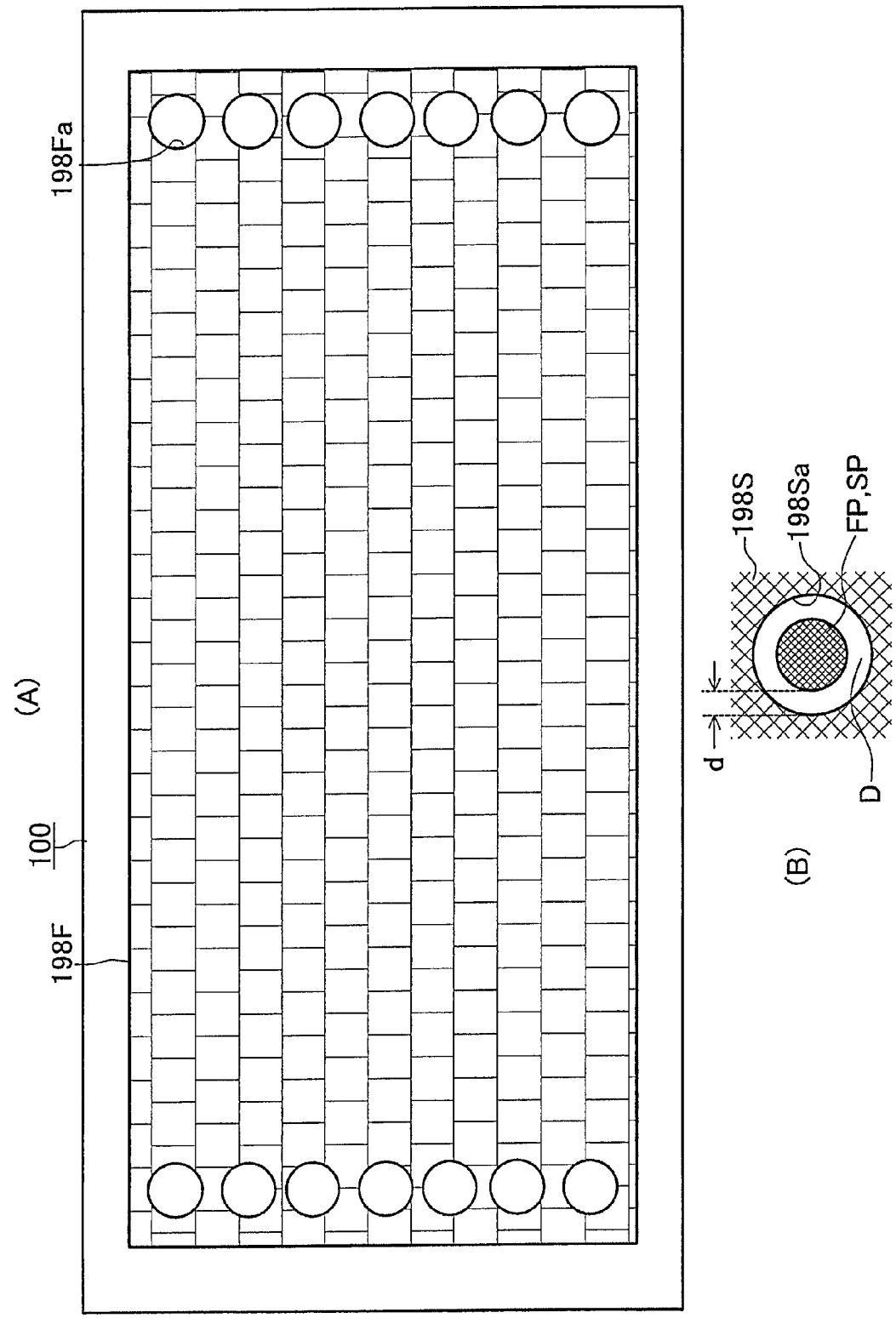
FIG. 3(A) is a plan view of the transmission substrate in FIG. 1.
FIG. 3(B) is a view showing a pad in the transmission substrate in FIG. 1.

FIG. 3 shows a plan view of the transmission substrate, which is the view on ground layer (198F). Ground layer (198F) (first ground layer) has opening (198Fa) directly above a first vertical wiring, and ground layer (198M) (second ground layer) has an opening directly above a second vertical wiring. The characteristic impedance of a signal route in the transmission substrate is controlled by openings. If an opening exists in a ground layer above a horizontal wiring, its characteristic impedance changes. Thus, a first horizontal wiring is not formed directly above a second horizontal wiring in the first embodiment.

The transmission substrate shown in FIG. 1 is formed with multiple resin insulation layers 50 and core layer 130. The core layer may be the same as resin insulation layers. If multiple resin insulation layers are formed, it is easier to form insulation layers and vertical wirings. It is also easier to control the characteristic impedance of horizontal wirings.

Figure 19:
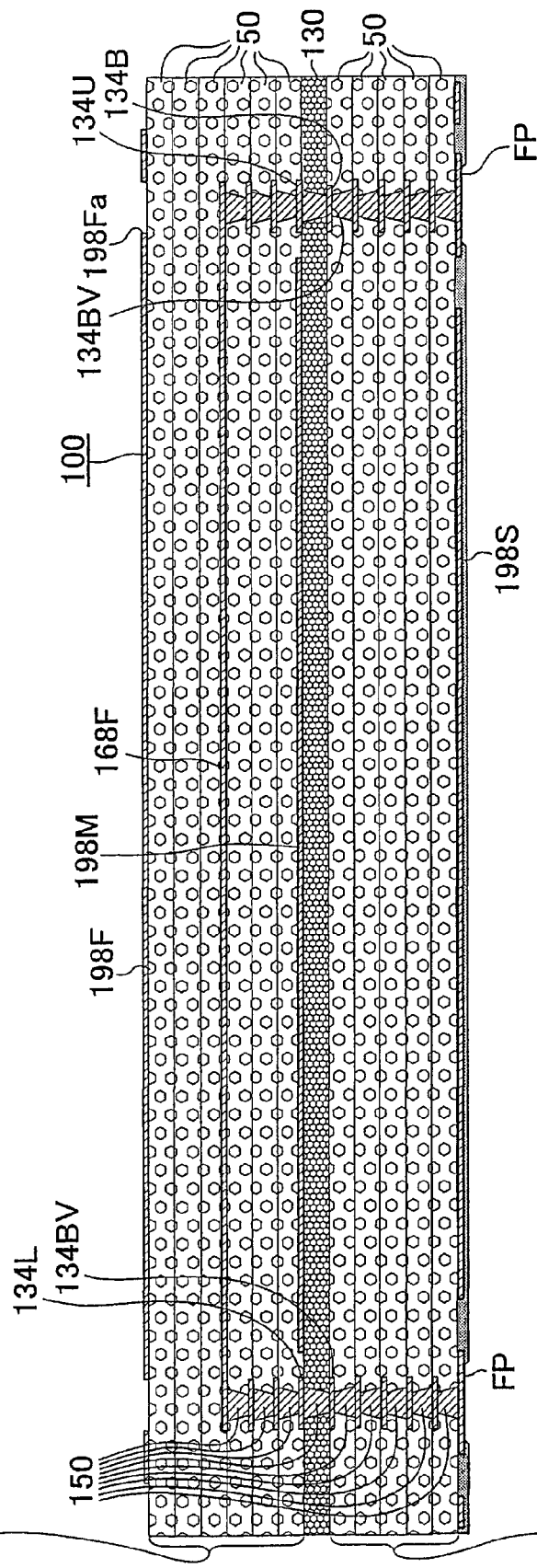
FIG. 19 is a magnified view of the transmission substrate in FIG. 1.

The transmission substrate in FIG. 1 includes core layer 130 having a first surface and a second surface opposite the first surface. FIG. 19 is a magnified view of the transmission substrate in FIG. 1. Conductive layers (134U, 134B) are formed on both surfaces of core layer 130. Conductive layer (134U) formed on the first surface includes via land (134L) and ground layer (198M) (second ground layer). Conductive layer (134B) includes receiving pad (134BV) of a via conductor. Multiple resin insulation layers (resin insulation layers on the first surface of the core layer) 50 are formed on the first surface of the core layer and on conductive layer (134U). Horizontal wiring (first horizontal wiring) (168F) is formed on those resin insulation layers. Multiple resin insulation layers (resin insulation layers on the first horizontal wiring) 50 are formed on the first horizontal wiring and on resin insulation layers (resin insulation layers on the first surface of the core layer). Ground layer (198F) (first ground layer) is formed on resin insulation layers (resin insulation layers on first horizontal wiring) 50. The first horizontal wiring is sandwiched by ground layer (198F) and ground layer (198M).

Multiple resin insulation layers (resin insulation layers under the second surface of the core layer) 50 are formed under the second surface of the core layer. Horizontal wiring (second horizontal wiring) (168S) is formed under the resin insulation layers. However, since a second horizontal wiring does not exist directly under a first horizontal wiring in the example shown in FIG. 1, no second horizontal wiring is shown in FIGS. 1 and 19. Multiple resin insulation layers (resin insulation layers under a second horizontal wiring) 50 are formed under the second horizontal wiring and resin insulation layers (resin insulation layers under the second surface of the core layer). Ground layer (198S) (third ground layer), first horizontal wiring pads (FP) and second horizontal wiring pads (SP) are formed under resin insulation layers (resin insulation layers under a second horizontal wiring). Other than those, ground pads electrically connected to each ground layer except for third ground layer (198S) are formed. Ground pads and second horizontal wiring pads are not shown in the drawings.

Ground pads include a first ground pad electrically connected to the first ground layer, a second ground pad electrically connected to the second ground layer, and a third ground pad which is part of the third ground layer. The first ground layer and a first ground pad are connected by first vertical ground wiring, and the second ground layer and a second ground pad are connected by second vertical ground wiring. Vertical ground wirings are formed with stacked vias the same as shown in FIGS. 11(A) and 11(B).

A solder-resist layer is formed under ground layer (198S), each pad and a resin insulation layer (resin insulation layer on a second horizontal wiring). The solder-resist layer has openings that expose each pad and ground layer (198S). Such openings are preferred to partially expose each pad and ground layer (198S). A solder-resist layer is formed on the first ground layer and the outermost resin insulation layer.

As shown in FIG. 1, a first vertical wiring is formed with stacked vias. A second vertical wiring is also formed with stacked vias, though it is not shown in FIG. 1. As shown in FIG. 1, stacked vias are structured by stacking via conductors that penetrate through their respective resin insulation layers. A first vertical wiring is formed in the peripheral portion of a printed wiring board, and a second vertical wiring is formed in the central portion of the printed wiring board.

In FIG. 1, the insulation layer on the first surface of the core layer, the insulation layer on the second surface of the core layer, the insulation layer on the first horizontal wiring, and the insulation layer on the second horizontal wiring are multilayered resin insulation layers. Since the distance is set wide between a horizontal wiring and a ground layer, the transmission substrate in FIG. 1 has multiple resin insulation layers between the horizontal wiring and the ground layer. That makes it easier to form via conductors. However, it is also an option to form each insulation layer as a single-layered resin insulation layer. It is advantageous from the viewpoints of cost and accuracy of insulation distance for insulation layers to be single-layered. Core layer 130 may also be a resin insulation layer.

Figure 10:
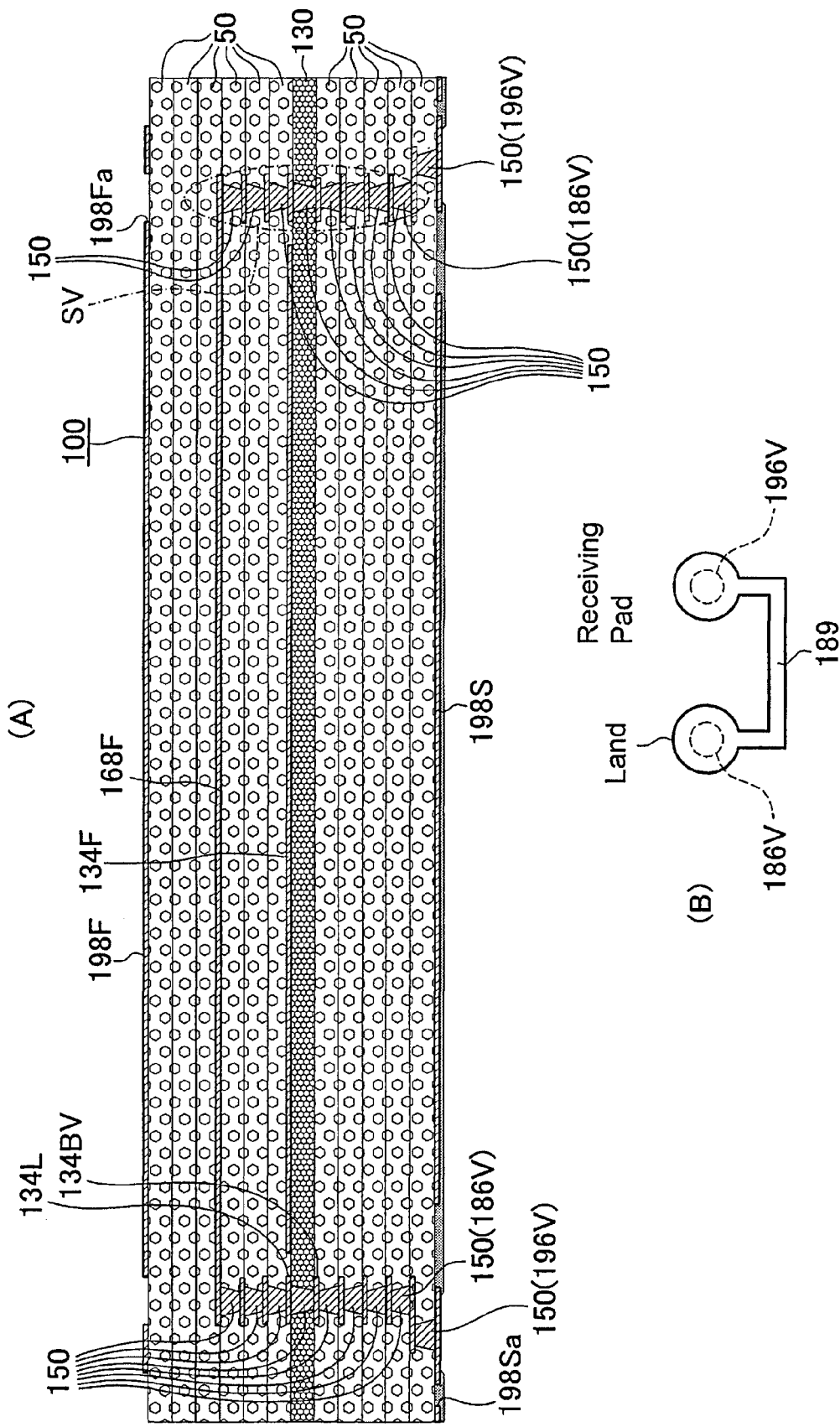
FIG. 10(A) is a view to illustrate a transmission substrate according to the modified example of the first embodiment.
FIG. 10(B) shows a detouring wiring.

The transmission substrate of the present embodiment shown in FIGS. 1, 10, 19 and others has multiple resin insulation layers. A resin insulation layer facing the packaging substrate is a first resin insulation layer, and a resin insulation layer on the first resin insulation layer is a second insulation layer. Third and fourth resin insulation layers are subsequently laminated in that order. In addition, each resin insulation layer has a first surface and a second surface opposite the first surface. The surface facing the packaging substrate is the second surface. FIG. 19 is a magnified view of the transmission substrate in FIG. 1. The core layer corresponds to a sixth resin insulation layer, and a resin insulation layer farthest from the packaging substrate (outermost resin insulation layer) is a 12th resin insulation layer.

FIG. 8(A) shows horizontal circuit (HW) and ground layer (GL) in packaging substrate 1000, and FIG. 8(B) shows horizontal wiring (HWL) and ground layer (GL) in transmission substrate 100 of the first embodiment. In the packaging substrate shown in FIG. 8(A), the thickness of a signal line (horizontal circuit) is set at 15 μm and its line width at 22 μm, the thickness of its upper and lower insulation layers (IL) at 30 μm, the distance between signal lines at 100 μm, and the width of ground layer (GLS) formed in the same layer as signal lines at 90 μm. The distance between a signal line and the ground layer formed in the same layer with the signal line is set at 33 μm. In setting so, the characteristic impedance of a horizontal circuit in the packaging substrate is 100Ω. Those values are examples.

In the transmission substrate shown in FIG. 8(B), insulation layer (IL) is formed with 10 resin insulation layers. The thickness of a signal line (horizontal wiring) (HWL) is set at 20 μm and its line width at 100 μm, and the thickness of its upper and lower insulation layers (IL) at 140 μm. Namely, the distance between a horizontal wiring and a ground layer is set at 140 μm. The distance between signal lines is set at 124 μm, and the width of ground layer (GLS) formed in the same layer as signal lines at 90 μm. The distance between a signal line and the ground layer formed in the same layer as signal lines is set at 100 μm. In setting so, the characteristic impedance of a horizontal wiring in the transmission substrate is 100Ω. Those values are examples.

FIG. 8(C) shows a transmission substrate according to a modified example of the first embodiment. In the modified example of the first embodiment, insulation layer (IL) is formed with 14 resin insulation layers. The thickness of a signal line (horizontal wiring) (HWL) is set at 20 μm, its line width at 123 μm, and the thickness of its upper and lower insulation layers at 220 μm. Namely, the distance between a horizontal line and a ground layer is set at 220 μm. The distance between signal lines is set at 124 μm, and the width of ground layer (GLS) formed in the same layer as signal lines at 150 μm. The distance between a signal line and the ground layer formed in the same layer as signal lines is set at 100 μm. Those values are examples. In setting so, the characteristic impedance of a horizontal wiring in the transmission substrate is 100Ω.

Figure 8:
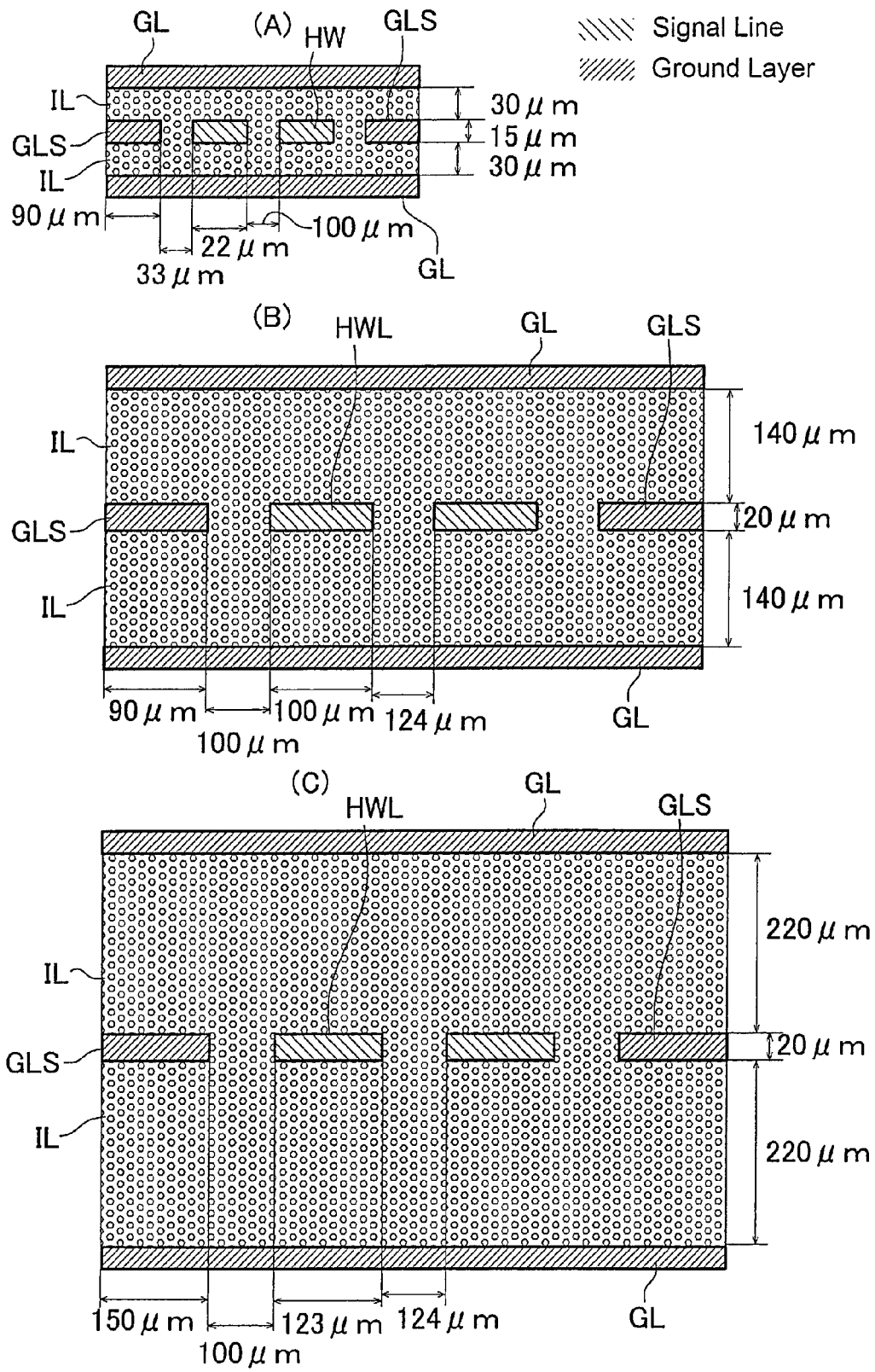
FIG. 8(A) shows wiring positions in a packaging substrate.
FIG. 8(B) shows wiring positions in a transmission substrate according to the first embodiment.
FIG. 8(C) shows wiring positions in a transmission substrate according to a modified example of the first embodiment.

In the first embodiment, transmission substrate 100 is mounted on packaging substrate 1000, and high-speed signals are transmitted through the transmission substrate. High-speed signals are transmitted over a long horizontal distance in the transmission substrate. High-speed signals are 10 GHz or higher, for example. As shown in FIG. 8, to reduce transmission loss in high-speed signals by maintaining the characteristic impedance at a constant value, the thickness of insulation layers and the thickness and width of signal lines increase. If such a stripline is formed in a packaging substrate, the thickness and dimensions of the packaging substrate increase. However, in the first embodiment and its modified example, since a stripline for transmitting high-speed signals is formed in a transmission substrate, the thickness and dimensions of a packaging substrate decrease. Therefore, printed wiring boards according to the first embodiment and its modified example can simultaneously transmit low-speed signals and high-speed signals with less loss. Moreover, thinner and smaller printed wiring boards are obtained according to the first embodiment and its modified example. Since high-speed signals are not transmitted over a long horizontal distance in the packaging substrate, a stripline for transmitting high-speed signals is not required in the packaging substrate.

Figure 9:
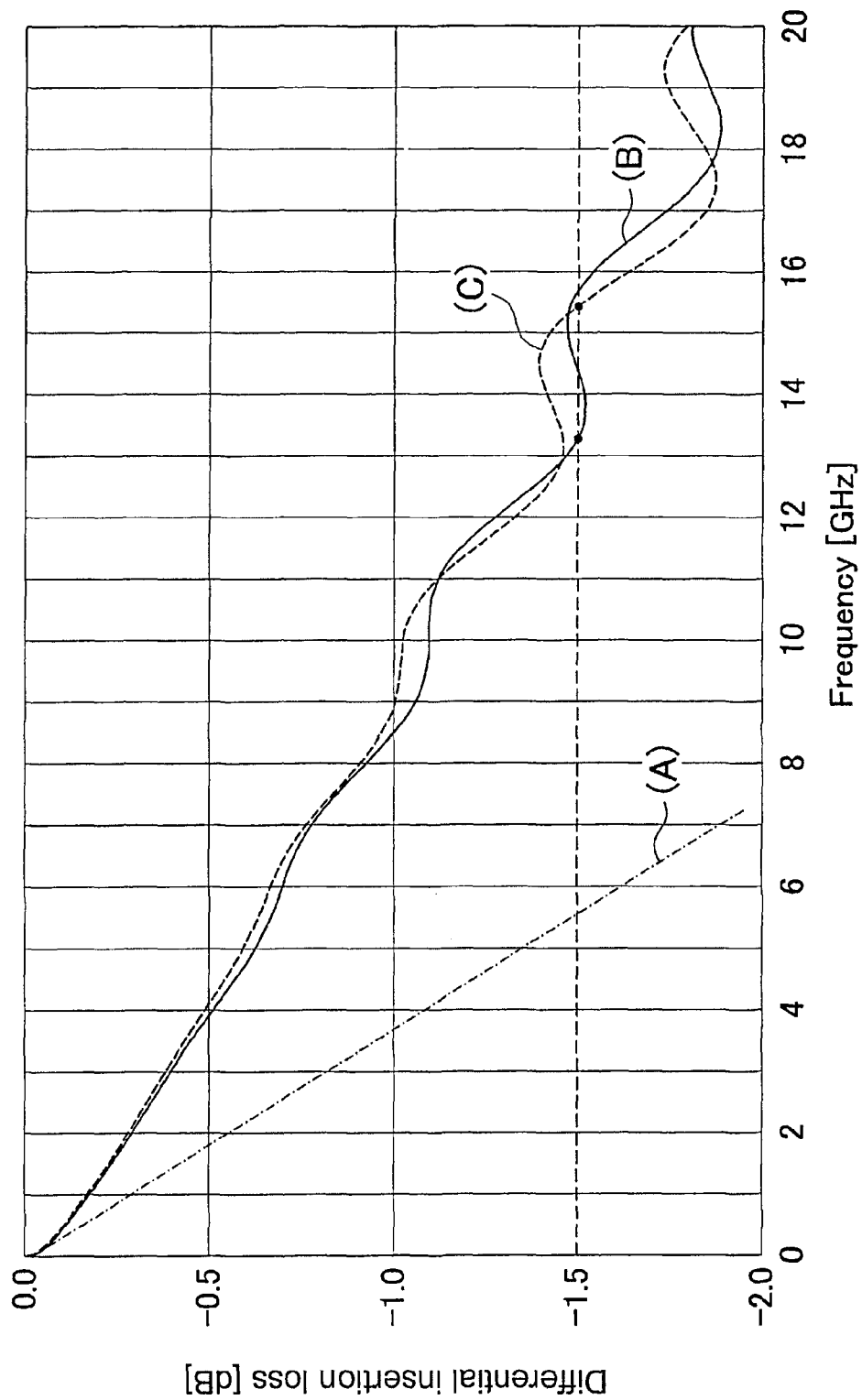
FIG. 9 is a graph showing relationships between frequencies and signal attenuation rates when signals are transmitted through the transmission route shown in FIG. 8.

FIG. 9 shows relationships between frequencies and loss characteristics to be expected when signals with a predetermined frequency are transmitted through a stripline shown in FIG. 8. Here, the target amount of attenuation is approximately 1.5 dB or lower. If the attenuation amount exceeds 1.5 dB, problems may arise in practical use. A chain line (A) indicates the loss characteristics in a stripline shown in FIG. 8(A). In the structure shown in FIG. 8(A), the attenuation amount is 1.5 dB or lower up to 5.6 GHz, but the amount exceeds 1.5 dB at 6 GHz. Therefore, the stripline shown in FIG. 8(A) is not suitable as a transmission route to transmit signals of 6 GHz or higher from the viewpoint of loss characteristics. A solid line (B) indicates the loss characteristics in a stripline shown in FIG. 8(B), and a broken line (C) indicates the loss characteristics in a stripline shown in FIG. 8(C). The stripline in FIG. 8(B) and the stripline in FIG. 8(C) are included in the first embodiment or the modified example of the first embodiment. In the stripline shown in FIG. 8(B), the attenuation amount is 1.5 dB or lower up to 13 GHz. In the stripline shown in FIG. 8(C), the attenuation amount is 1.5 dB or lower up to 15 GHz. From the viewpoint of loss characteristics, the striplines shown in FIGS. 8(B) and 8(C) are suitable for transmitting high-speed signals. From the results in FIG. 9, when low-speed signals (signals at approximately 6 GHz or lower) and high-speed signals (signals at approximately 10 GH or higher) are transmitted through a printed wiring board, it is thought that striplines with different structures are used so that the characteristic impedance and loss characteristics are both satisfied. It is thought to be difficult to form a stripline shown in FIG. 8(A) and another stripline shown in FIG. 8(B) or 8(C) in one packaging substrate, because wiring dimensions and thicknesses of insulation layers are largely different in a stripline shown in FIG. 8(A) and another stripline shown in FIG. 8(B) or 8(C). To overcome such difficulty, a printed wiring board according to an embodiment of the present invention includes a packaging substrate suitable for transmitting low-speed signals and a transmission substrate suitable for transmitting high-speed signals.

In the transmission substrate of the first embodiment, a vertical wiring has a stacked structure (stacked vias) formed by stacking each via conductor 150 directly on its lower via conductor (FIG. 19). Accordingly, a first pad and a horizontal wiring are connected by way of a vertical route. A second pad and a horizontal wiring are also connected by way of a vertical route. Therefore, a first pad and a horizontal wiring as well as a second pad and the horizontal wiring are connected by the shortest distance. Here, "horizontal" means a parallel direction to a surface of the packaging substrate, and "vertical" means a direction perpendicular to the surface of the packaging substrate. In addition, since stacked vias are positioned to be substantially symmetrical at both ends of the transmission substrate, warping seldom occurs in the transmission substrate. In a vertical wiring, the direction of via conductors formed in the core layer and in the resin insulation layers above the core layer is opposite the direction of via conductors formed in the resin insulation layers under the core layer. The land of each via conductor formed in the core layer and in the resin insulation layers above the core layer is formed on the first surface of each resin insulation layer, whereas the land of each via conductor formed in the resin insulation layers under the core layer is formed on the second surface of each resin insulation layer.

In a printed wiring board according to the first embodiment, the line width of signal lines (168F, 168S) in the transmission substrate is three times or more as wide as the line width of signal lines in the packaging substrate. In addition, the thickness of insulation layers on and under signal lines (168F, 168S) (the distance between a signal line and a ground layer) is three times or more as great as the thickness of interlayer resin insulation layers on and under signal lines in the packaging substrate. Therefore, if signals that have frequencies three times or more as high as those of signals transmitted through signal lines in the packaging substrate are transmitted through signal lines (168F, 168S) in the transmission substrate, the characteristic impedance in horizontal wirings (signal lines) in the transmission substrate is approximately the same as the characteristic impedance in horizontal circuits (signal lines) in the packaging substrate.

A printed wiring board according to the first embodiment includes a packaging substrate having signal lines for transmitting signals at a predetermined speed and a transmission substrate having signal lines for transmitting signals at a speed three times or more as fast as the predetermined speed. Since a packaging substrate and a transmission substrate are designed according to their respective signal speeds, the size of a printed wiring board is prevented from being enlarged.

In a printed wiring board of the first embodiment, the characteristic impedance of signal lines (168F, 168S) in the transmission substrate is substantially equal to the characteristic impedance of the signal lines in the packaging substrate. Accordingly, reflection or the like seldom occurs, and attenuation in high-speed signals decreases.

Figure 7:
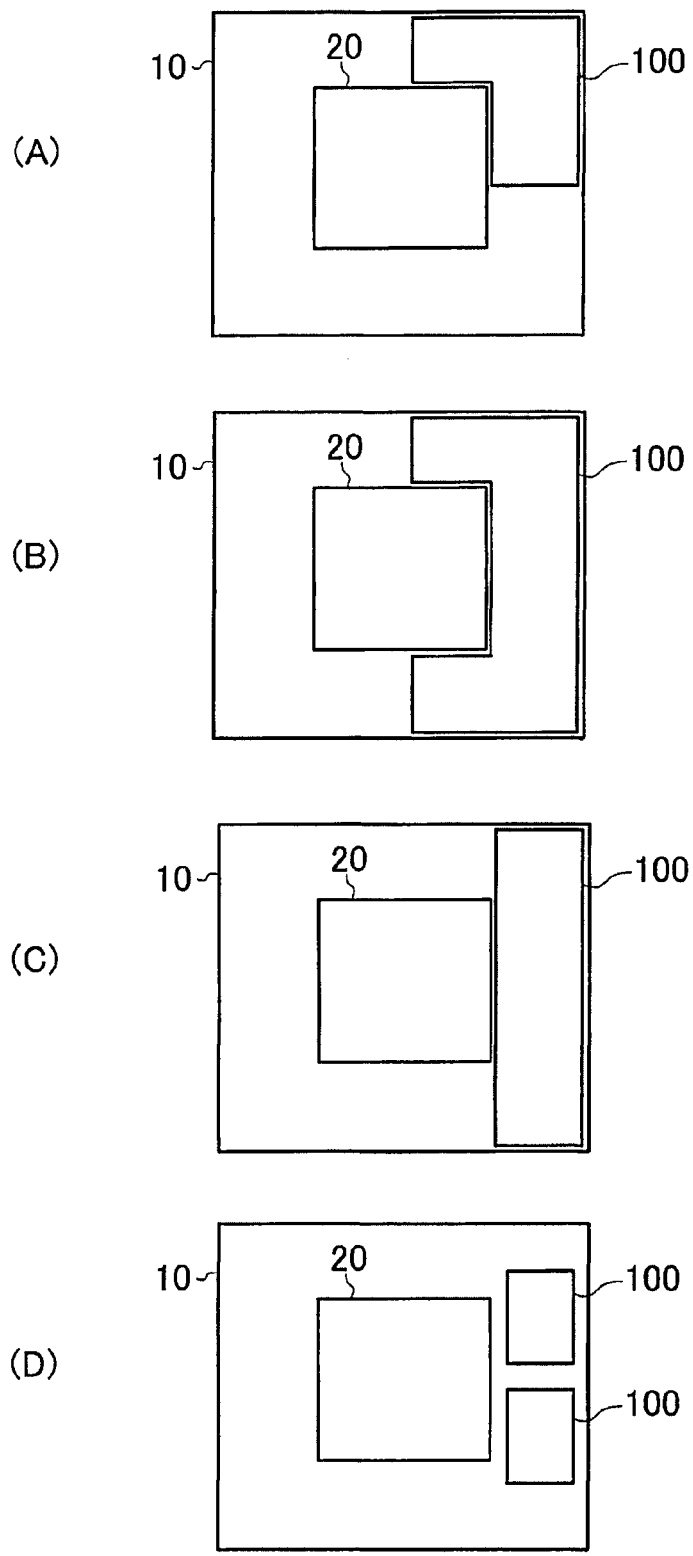
FIGS. 7(A)-7(D) are views showing examples of the shape of a transmission substrate.

FIG. 7 shows plan views of transmission substrates. A transmission substrate is formed around the pad group for mounting an IC chip. Depending on the number of horizontal wirings, a transmission substrate is formed in any shape. The transmission substrate shown in FIG. 7(A) has an L shape, the transmission substrate shown in FIG. 7(B) has substantially a U shape, and the transmission substrate shown in FIG. 7(C) has a rectangular shape. Two or more transmission substrates may be formed (FIG. 7(D)). Interference between IC chip 20 and a transmission substrate is prevented by forming space between the transmission substrate and the IC chip.

FIG. 3(A) shows the shape of first ground layer (196F). FIG. 3(B) shows a horizontal wiring pad and third ground layer (198S) in FIG. 2. As shown in FIG. 3(A), the first ground layer has opening (198Fa) at least directly above a first vertical wiring. Opening (198Fa) may also be formed directly above a second vertical wiring and above a first vertical wiring shown in FIG. 2. Since the distance between a second vertical wiring and the first ground layer is greater than the distance between a first vertical wiring and the first ground layer, the first ground layer does not have much effect on a second vertical wiring and a second horizontal wiring. In addition, a horizontal wiring pad is formed in opening (198Sa) formed in the third ground layer with space (D). The width of space (D) is set at (d). Width (d) is greater than the distance to maintain insulation reliability between a horizontal wiring pad and the third ground layer.

Figure 18:
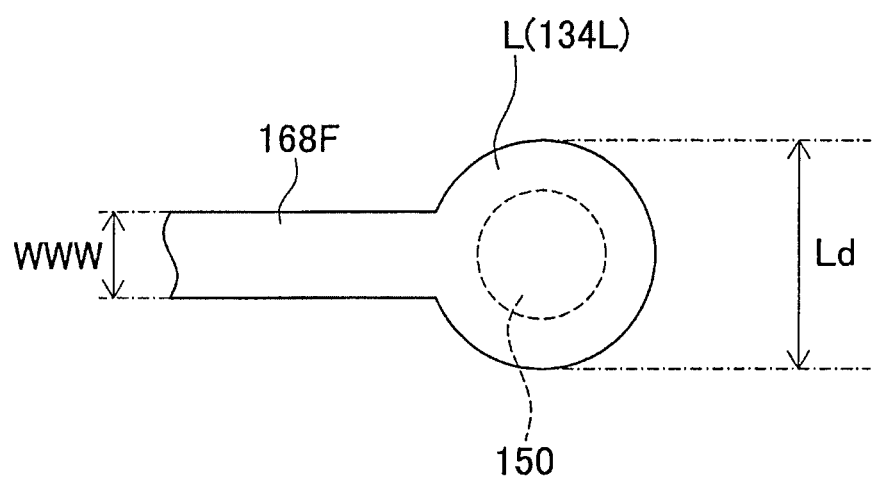
FIG. 18 is a view showing a land of a vertical wiring at the intersection of the vertical wiring and a horizontal wiring in a transmission substrate.

In the transmission substrate according to the first embodiment, land L (134L) of a vertical wiring is formed where the first vertical wiring intersects with a horizontal wiring (FIG. 18). FIG. 18 is a plan view. If a vertical wiring is formed as stacked vias or via conductors, the land is that of the outermost via conductor or stacked via. The land diameter (Ld) is greater than width (WWW) of the horizontal wiring. Therefore, the capacitance between the land and the ground layer is greater than the capacitance between the horizontal wiring and the ground layer. The capacitance between the land and the ground layer is the capacitance formed in an insulation layer sandwiched by the land and the upper surface of the via conductor in the land and the ground layer. Therefore, the characteristic impedance of the land portion is smaller than the characteristic impedance of the horizontal wiring. As a result, signals are reflected between the land and the horizontal wiring, causing signal transmission loss. To prevent such loss, opening (198Fa) is formed in the ground layer directly above the vertical wiring (FIG. 3(A)). The capacitance between the land and the ground layer is reduced because of the opening, resulting in an increase in the characteristic impedance of the land portion. Accordingly, the characteristic impedance of the land portion becomes substantially the same as the characteristic impedance of the horizontal wiring. Since the difference in characteristic impedance values between the vertical wiring and the horizontal wiring decreases, the amount of signal reflection is reduced, resulting in less signal attenuation. The size of opening (198Fa) is preferred to be greater than the size of the land.

Also, a first horizontal wiring pad and a second horizontal wiring pad are formed in openings (198Sa) respectively with space (D) in the third ground layer (FIG. 3(B)). The second ground layer is also preferred to have opening (198Ma) directly above a second vertical wiring, the same as the first ground layer. In such a case, the second ground layer is shaped the same as in FIG. 3(A). The relationship between the land diameter of a second vertical wiring and the size of opening (198Ma) is the same as that between the land diameter of a first vertical wiring and opening (198Fa).

FIG. 10(A) shows a cross-sectional view of a transmission substrate according to a modified example of the first embodiment. In that example, first vertical wirings are not in a stacked structure. Although not shown in the drawing, second vertical wirings are not in a stacked structure, either. Stacked via structure (SV) is formed from the second resin insulation layer to the ninth resin insulation layer; however, stacked via structure (SV) is not formed directly on via conductor (196V) formed in the first resin insulation layer. FIG. 10(B) shows part of a conductive circuit on the first surface of the first resin insulation layer in FIG. 10(A), and shows detouring wiring 189 that connects stacked via structure (SV) and via conductor (196V). The via conductor in the resin insulation layer is connected to the stacked vias formed from the second resin insulation layer through the ninth resin insulation layer by the detouring wiring. In FIG. 10(A), a vertical wiring includes stacked via structure (SV), detouring wiring 189 and via conductor (196V). In FIG. 10, a vertical wiring is formed with partial stacked via structure (SV), detouring wiring 189 and via conductor (196V). A first horizontal wiring is formed on the first surface of the ninth resin insulation layer, and the above vertical wiring connects from a horizontal wiring pad to a first horizontal wiring. The detouring wiring connects the receiving pad of via conductor (196V) formed in the first resin insulation layer and the land of via conductor (186V) formed in the second resin insulation layer.

When the characteristic impedance is compared at the input/output portion between the packaging substrate and transmission substrate and at the rest, the characteristic impedance at the input/output portion is lower than the characteristic impedance at the rest. If characteristic impedance values are different between them, signal reflection occurs at the input/output potion. Such reflection causes signal attenuation. To reduce signal attenuation, a detouring wiring is formed in a vertical wiring of the transmission substrate in FIG. 10. In FIG. 10, the vertical wiring is not extended in a line from a horizontal wiring pad to the horizontal wiring. A detouring wiring may also be formed on the second surface of the first resin insulation layer between a horizontal wiring pad and a via conductor formed in the first resin insulation layer, for example. Alternatively, a detouring wiring may be formed between a land and a receiving pad of vertically adjacent via conductors. To increase the characteristic impedance of a detouring wiring, the shape of a detouring wiring is preferred to be a coil, U-shape, arc or L-shape. Examples of detouring wiring are shown in FIG. 20.

FIG. 11 shows transmission substrates according to three embodiments.

FIG. 11(A) shows a cross-sectional view of a transmission substrate according to the first embodiment. The thickness of a horizontal wiring is set at 20 μm, and its width at 123 μm. The distance between the horizontal wiring and a ground layer is set at 220 μm. As shown in FIG. 11(A), a vertical wiring is formed in a straight line. In addition, the upper ground layer (first ground layer) does not have an opening above the vertical wiring.

FIG. 11(B) shows a cross-sectional view of a transmission substrate according to the second embodiment. The measurements of a horizontal wiring (signal route) and the distance between a horizontal wiring and a ground layer are the same as those in the first embodiment. A vertical wiring is formed in a straight line as shown in FIG. 11(B). Also, the upper ground layer (first ground layer) has an opening above the vertical wiring. The opening size is greater than the size of the land of a vertical wiring. When a vertical wiring is formed with multiple via conductors, the size of a land of the vertical wiring indicates the land diameter of a via conductor in the uppermost layer or the diameter of the largest via land among multiple via lands. Since the via conductor in the uppermost layer is the closest to the first ground layer, an opening of the first ground layer is preferred to be greater than at least the land diameter of the via conductor in the uppermost layer. If the land diameter of via conductors other than the via conductor in the uppermost layer is greater than the land diameter of the uppermost via conductor, opening (198Fa) of first ground layer (198F) is set greater than the size of the land of a vertical wiring. The capacitance between a land of a vertical wiring and a ground layer is reduced.

FIG. 11(C) shows a cross-sectional view of a transmission substrate according to the third embodiment. The measurements of a horizontal wiring and the distance between the horizontal wiring and a ground layer are the same as in the first embodiment. A vertical wiring is not formed in a straight line as shown in FIG. 11(C). A vertical wiring has substantially arc-shaped detouring wiring 189 on the first surface of the first resin insulation layer (FIG. 20(A)). Also, upper ground layer (first ground layer) (198F) has opening (198Fa) above a vertical wiring. The size of the opening is greater than the land of a vertical wiring and a detouring wiring. The opening includes at least a land and the detouring wiring of a vertical wiring; when the opening, the detouring wiring and the land of a vertical wiring are projected on the same plane at an equal magnification ratio, the detouring wiring and the vertical wiring are positioned in the opening. A second horizontal wiring and others are not shown in FIG. 11 for the purpose of simplification.

Figure 12:
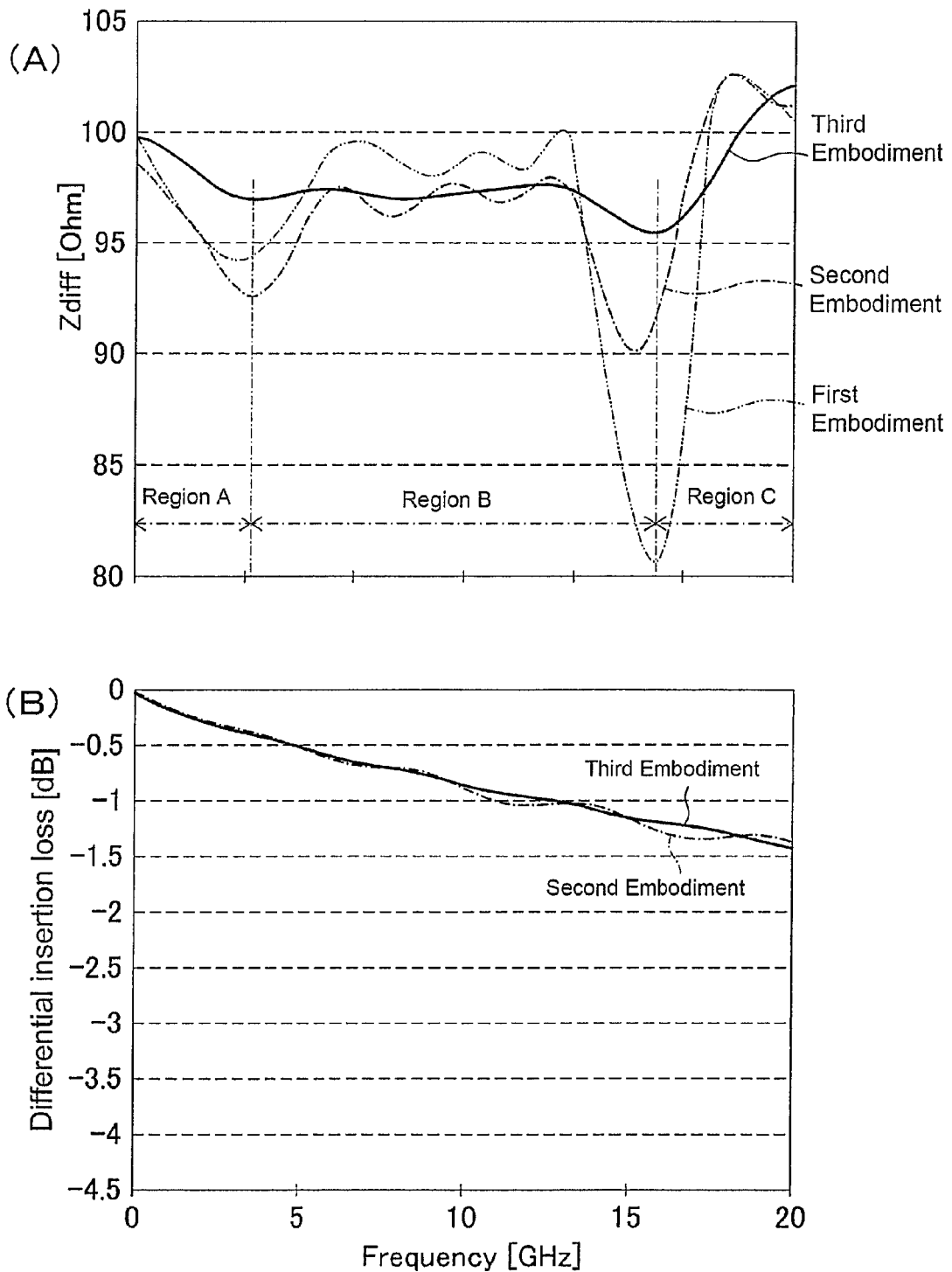
FIG. 12(A) is a graph showing the characteristic impedance of a printed wiring board having a transmission substrate according to each embodiment.
FIG. 12(B) is a graph showing signal attenuation rates in relation to frequencies.

FIG. 12 shows simulation results of characteristic impedance and signal attenuation amounts in the first, second and third embodiments. FIG. 12(A) shows the results of characteristic impedance, and FIG. 12(B) shows attenuation amounts. The vertical axis of FIG. 12(A) shows characteristic impedance, and the horizontal axis shows positions of signal routes. Signals are transmitted from a signal wiring in a packaging substrate (region A) to a signal wiring in a transmission substrate (region B) and then returned to a signal wiring of the packaging substrate (region C). From the results of embodiments in FIG. 12(A), it is found that characteristic impedance is lower at the input/output portion between a packaging substrate and a transmission substrate. In FIG. 12(B), the attenuation amount does not exceed 1.5 dB up to signals of 20 GHz. From FIG. 12(A), it is found that characteristic impedance comes closer to 100Ω by forming an opening in a ground layer. By forming a detouring wiring, it is found that characteristic impedance comes even closer to 100Ω. Also, when FIG. 12(B) and FIG. 9 are compared, it is found that signal attenuation decreases by forming an opening and a detouring wiring. The attenuation amounts in the first embodiment are the same as (C) in FIG. 9.

Method for Manufacturing Transmission Substrate

A method for manufacturing a transmission substrate is described with reference to FIGS. 4~6.

Double-sided copper-clad laminate (130M) is prepared (FIG. 4(A)). The thickness of the resin insulation layer in double-sided copper-clad laminate 130 is 55 μm. A laser is used to form opening 131 which penetrates through the resin insulation layer and reaches copper foil 128 on a lower-surface side (FIG. 4(B)). Electroless plating and electrolytic plating are performed to form via conductor 150 in opening 131 (FIG. 4(C)). Etching resist 135 with a predetermined pattern is formed (FIG. 4(D)), copper foil 128 is etched away from where the etching resist is not formed, via land (134L) and ground layer (196M) are formed on a first surface of the resin insulation layer, and receiving pad (134BV) of a via conductor is formed on a second surface of the resin insulation layer (FIG. 4(E)). Core layer 130 is formed.

Figure 5:
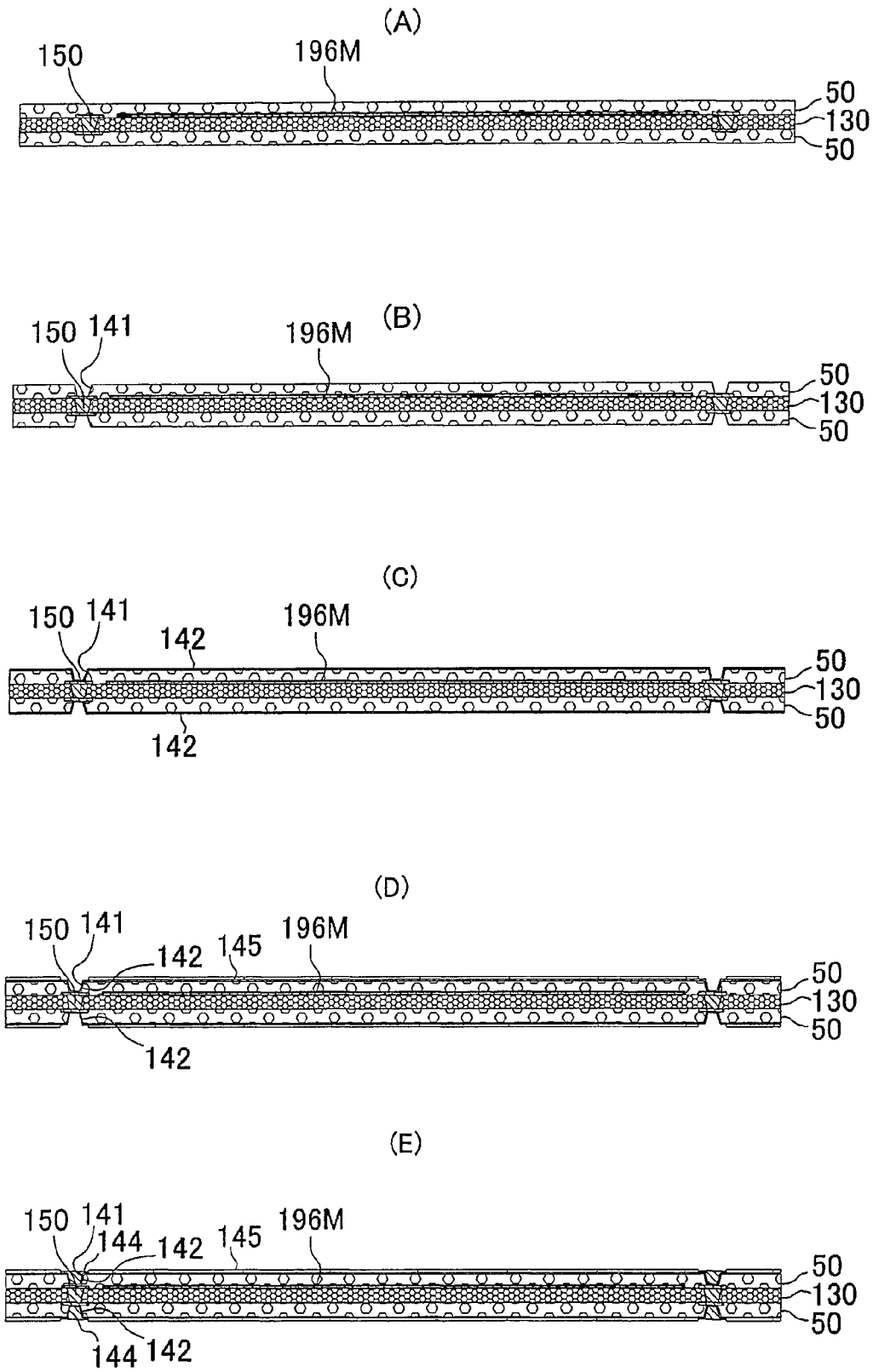
FIGS. 5(A)-5(E) are views showing steps for manufacturing a transmission substrate according to the first embodiment.

Resin insulation layer 50 is laminated on the first and second surfaces of the core layer (FIG. 5(A)). Opening 141 reaching via conductor 150 is formed in resin insulation layer 50 (FIG. 5(B)). Electroless plated film 142 is formed on a surface of resin insulation layer 50 (FIG. 5(C)). Plating resist 145 with a predetermined pattern is formed on electroless plated film 142 (FIG. 5(D)). Electrolytic plated film 144 is formed on portions where plating resist is not formed (FIG. 5(E)). Plating resist 145 is removed and electroless plated film between portions of electrolytic plated film 144 is removed so that via conductor 150 and via land (134L) are formed (FIG. 6(A)). An intermediate substrate having three conductive layers is completed. Resin insulation layers (50, 50) are laminated on both surfaces of the intermediate substrate. Then, the same steps as in FIG. 5(B) through FIG. 6(A) above are repeated. Via conductors are formed in resin insulation layers (50, 50), and a conductive layer including lands of via conductors (via lands) and horizontal wiring is formed on the first surface of resin insulation layer 50 and on the second surface of resin insulation layer 50. Resin insulation layers (50, 50) are further laminated on resin insulation layers (50, 50). Moreover, the same steps as in FIG. 5(B) through FIG. 6(A) above are repeated. Then, via conductors are formed in resin insulation layers (50, 50), and a ground layer is formed on the first surface of resin insulation layer 50 and on the second surface of resin insulation layer 50. The thickness and the material are the same in each resin insulation layer. Also, each via conductor is stacked vertically. The first ground layer has an opening above a vertical wiring. Solder-resist layer 7000 is formed on outermost resin insulation layers (50, 50) on both sides. A transmission substrate is completed (FIG. 6(C)).

Second Embodiment

FIG. 13 shows a transmission substrate in a second embodiment. Since the packaging substrate is the same as that in the first embodiment, its description is omitted here. In the second embodiment, core layer 130 and resin insulation layer 50 are alternately laminated. A flexible resin substrate made of Teflon is used for resin insulation layers.

FIG. 14(A) shows striplines in packaging substrate 1000, and FIG. 14(B) shows striplines in the transmission substrate of the second embodiment. The same as in the first embodiment, in a packaging substrate shown in FIG. 14(A), the thickness of a signal line is set at 15 μm, its line width at 22 μm, the thickness of its upper and lower interlayer resin insulation layers at 30 μm, the distance between signal lines at 100 μm, the width of a ground layer in the same layer as signal lines at 90 μm, and the distance between the ground layer and a signal line at 33 μm. In so setting, the characteristic impedance of a horizontal circuit in the packaging substrate is 100Ω.

In the transmission substrate shown in FIG. 14(B), the thickness of a signal line is set at 18 μm, its line width at 94 μm, the thickness of its upper and lower interlayer resin insulation layers at 75 μm, the distance between signal lines at 142 μm, the width of a ground layer formed in the same layer as signal lines at 225 μm, and the distance between the ground layer and a signal line at 71 μm. By setting so, the characteristic impedance of a horizontal wiring in the transmission substrate is 100Ω.

In the first and second embodiments, a printed wiring board is formed with a transmission substrate that transmits high-speed signals and with packaging substrate 1000. Therefore, the characteristic impedance of a stripline in the transmission substrate can be matched with the characteristic impedance of a stripline in the packaging substrate. Accordingly, when high-speed signals are transmitted through a printed wiring board, signal attenuation is reduced.

The line width of a signal line and the thickness of insulation layers are different in a stripline for low-speed signals and a stripline for high-speed signals. The material for insulation layers may even be different. Thus, if a stripline for low-speed signals and a stripline for high-speed signals are formed in a packaging substrate, the packaging substrate is enlarged. However, printed wiring boards in the embodiments are formed with a transmission substrate suitable for transmitting high-speed signals and a packaging substrate suitable for transmitting low-speed signals.

Figure 14:
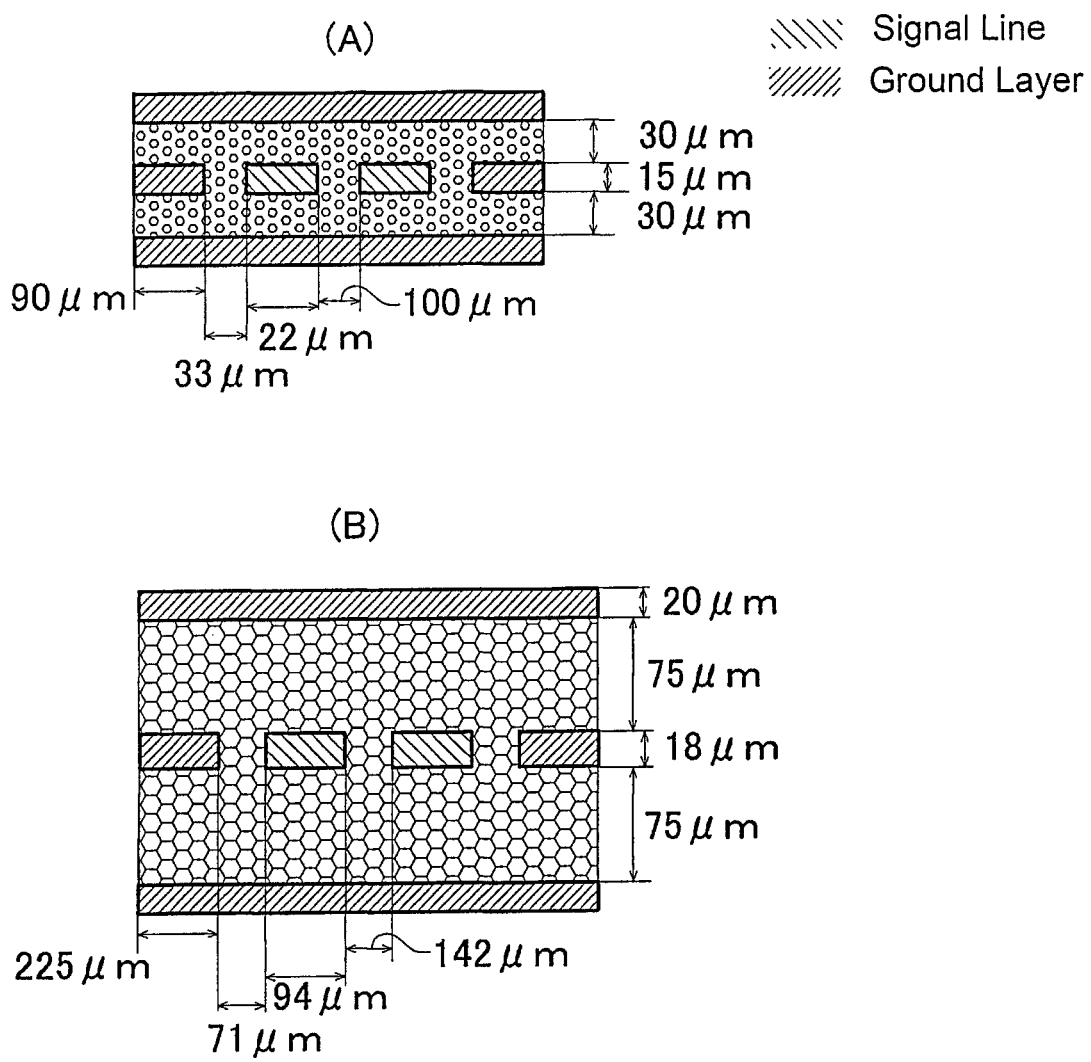
FIG. 14(A) is a view showing wiring positions in a packaging substrate of the second embodiment.
FIG. 14(B) is a view showing wiring positions in a transmission substrate of the second embodiment.
Figure 15:
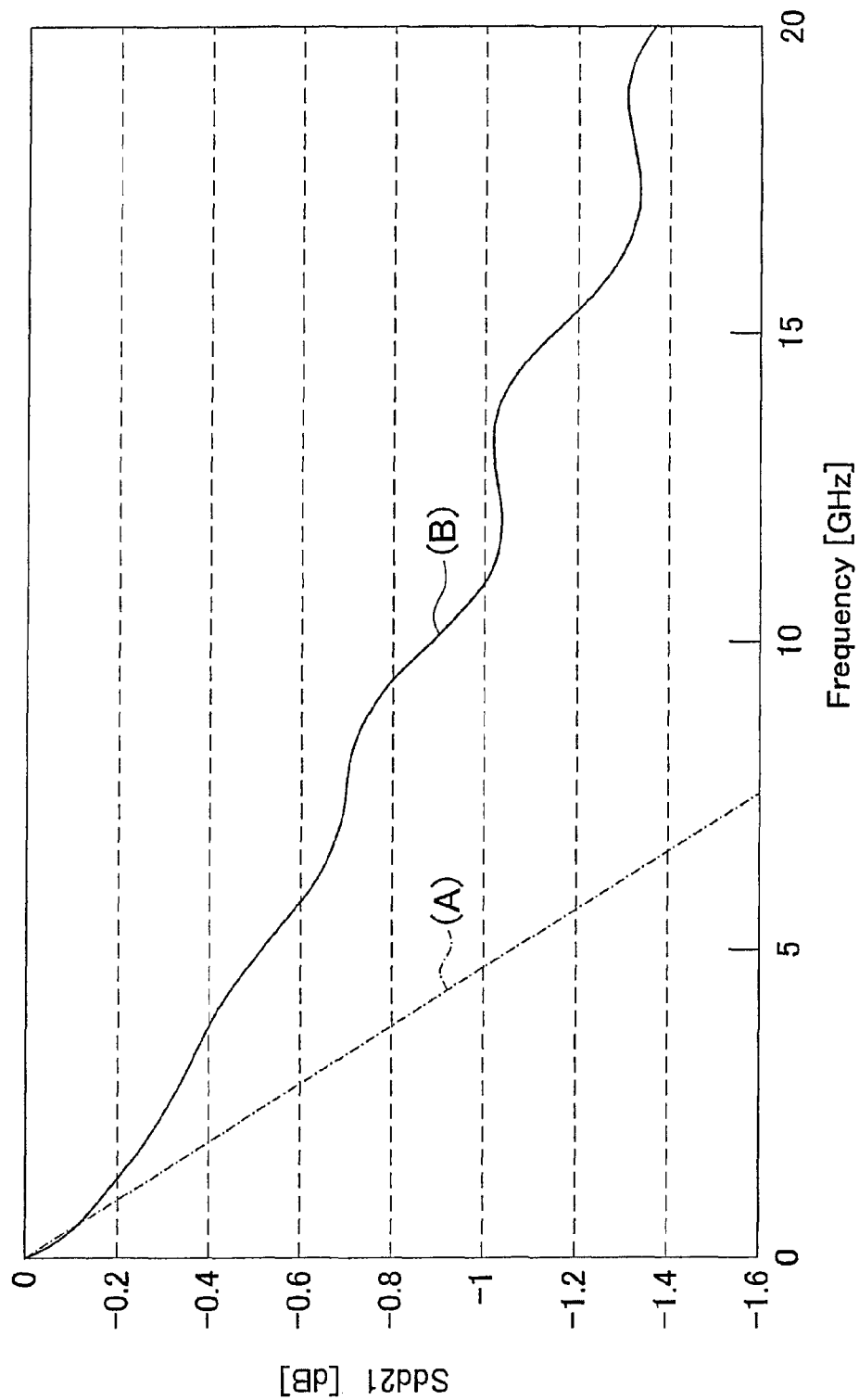
FIG. 15 is a graph showing signal attenuation rates in relation to frequencies in the transmission substrate of the second embodiment.

FIG. 15 shows simulation results of loss characteristics in a transmission substrate of the second embodiment. A chain line (A) shows loss characteristics in a stripline shown in FIG. 14(A). The attenuation amount is 1.5 dB or lower at 5.7 GHz, but the attenuation amount exceeds 1.5 dB at 6 GHz. A solid line (B) shows the loss characteristics in a transmission substrate of the second embodiment shown in FIG. 14(B). In the transmission substrate of the second embodiment, the attenuation amount does not exceed 1.5 dB at 20 GHz. Therefore, high-speed transmission is accomplished. A packaging substrate may be formed by a method similar to that described in U.S. 2005/280130A1. A solder-resist layer includes openings that expose a pad group, first pad, second pad and ground pad.

A transmission substrate in each embodiment may also include ground layer (GLS) formed parallel to horizontal wiring (HWL) (FIGS. 8, 14). Alternatively, land (AVL) of a via conductor connected to a ground layer may be formed along a horizontal wiring in each embodiment (FIG. 22). FIG. 22(A) shows a resin insulation layer on which a horizontal wiring is formed, the horizontal wiring on the resin insulation layer, and land (AVL). FIG. 22(B) shows a cross-section at the X-X line in FIG. 22(A).

A printed wiring board according to an embodiment of the present invention includes a packaging substrate having a pad group for mounting an electronic component and a transmission substrate mounted on the packaging substrate in a region that excludes the pad group. The packaging substrate further includes a first pad which is formed in a peripheral region of the packaging substrate and which is for mounting the transmission substrate, and a second pad which is formed between the first pad and the pad group and which is for mounting the transmission substrate, and the second pad is electrically connected to a signal pad in the pad group. The transmission substrate includes a horizontal wiring which electrically connects the second pad and the first pad and which is for transmitting signals.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a packaging substrate having a plurality of pads; and
a transmission substrate mounted on the plurality of pads of the packaging substrate,
wherein the packaging substrate has a pad group comprising a plurality of pads configured to mount an electronic component, the plurality of pads mounting the transmission substrate includes a first pad positioned in a peripheral portion of the packaging substrate and a second pad positioned between the first pad and the pad group, the second pad is electrically connected to a signal pad of the pads in the pad group, and the transmission substrate includes a horizontal wiring which electrically connects the second pad and the first pad and which transmits a signal between the second pad and the first pad.

2. The printed wiring board according to claim 1, wherein the transmission substrate further includes a vertical wiring connecting the first pad and one end of the horizontal wiring and a vertical wiring connecting the second pad and the other end of the horizontal wiring.

3. The printed wiring board according to claim 2, wherein the vertical wiring connected to the first pad comprises a via conductor, and the vertical wiring connected to the second pad comprises a via conductor.

4. The printed wiring board according to claim 2, wherein the vertical wiring connected to the first pad comprises a stacked-via structure comprising a plurality of via conductors vertically stacked, and the vertical wiring connected to the second pad comprises a stacked-via structure comprising a plurality of via conductors vertically stacked.

5. The printed wiring board according to claim 2, wherein the horizontal wiring is a stripline, the transmission substrate has a ground layer formed along the horizontal wiring, and the ground layer has an opening above the vertical wiring connected to the first pad and an opening above the vertical wiring connected to the second pad.

6. The printed wiring board according to claim 2, wherein at least one of the vertical wiring connected to the first pad and the vertical wiring connected to the second pad has a detouring wiring which increases a characteristic impedance.

7. The printed wiring board according to claim 2, wherein the transmission substrate has a first ground layer formed above the horizontal wiring and a second ground layer formed below the horizontal wiring, and the first ground layer has an opening above the vertical wiring connected to the first pad and an opening above the vertical wiring connected to the second pad.

8. The printed wiring board according to claim 1, wherein the horizontal wiring is configured to transmit a signal having a frequency of 10 GHz or higher.

9. The printed wiring board according to claim 1, wherein the packaging substrate further includes a horizontal circuit extending from the signal pad to the peripheral portion of the packaging substrate, and the horizontal wiring is configured to transmit a signal having a frequency of three times or more as high as a frequency of a signal transmitted through the horizontal circuit.

10. The printed wiring board according to claim 9, wherein the horizontal wiring has a line width which is three times or more as wide as a line width of the horizontal circuit.

11. The printed wiring board according to claim 9, wherein the horizontal wiring has a characteristic impedance which is substantially equal to a characteristic impedance of the horizontal circuit.

12. The printed wiring board according to claim 1, wherein the horizontal wiring is a stripline.

13. The printed wiring board according to claim 12, wherein the packaging substrate includes an interlayer resin insulation layer, the transmission substrate has a ground layer formed along the horizontal wiring, and the horizontal wiring has an insulation distance to the ground layer which is three times or more as great as a thickness of the interlayer resin insulation layer.

14. The printed wiring board according to claim 1, wherein the transmission substrate is formed in an L-shape.

15. The printed wiring board according to claim 1, wherein the transmission substrate is formed in substantially a U-shape.

16. The printed wiring board according to claim 1, wherein the transmission substrate has a first ground layer formed above the horizontal wiring and a second ground layer formed below the horizontal wiring.

17. The printed wiring board according to claim 1, wherein the packaging substrate comprises a buildup structure.

18. The printed wiring board according to claim 1, wherein the packaging substrate comprises a core substrate and a buildup structure formed on a surface of the core substrate.

19. The printed wiring board according to claim 1, wherein the packaging substrate comprises a core substrate and a buildup structure formed on a surface of the core substrate, and the pad group and the plurality of pads mounting the transmission substrate are formed on a surface of the buildup structure.

20. The printed wiring board according to claim 1, wherein the packaging substrate comprises a core substrate and a buildup structure formed on a surface of the core substrate, the buildup structure comprises a plurality of buildup layers and a plurality of conductor circuits, and the pad group and the plurality of pads mounting the transmission substrate are formed on a surface of the buildup structure.

* * * * *